US012363912B2

(12) United States Patent
Huang et al.

(10) Patent No.: US 12,363,912 B2
(45) Date of Patent: Jul. 15, 2025

(54) FERROELECTRIC MEMORY DEVICE WITH A METAL LAYER HAVING A CRYSTAL ORIENTATION FOR IMPROVING FERROELECTRIC POLARIZATION AND METHOD FOR FORMING THE FERROELECTRIC MEMORY DEVICE

(71) Applicant: Taiwan Semiconductor Manufacturing Company, Ltd., Hsinchu (TW)

(72) Inventors: Yen-Chieh Huang, Changhua County (TW); Hai-Ching Chen, Hsinchu (TW); Chung-Te Lin, Tainan (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 78 days.

(21) Appl. No.: 18/363,049

(22) Filed: Aug. 1, 2023

(65) Prior Publication Data
US 2024/0023342 A1 Jan. 18, 2024

Related U.S. Application Data

(62) Division of application No. 17/394,757, filed on Aug. 5, 2021, now Pat. No. 11,903,217.

(51) Int. Cl.
*H10B 51/30* (2023.01)
*H10B 51/00* (2023.01)
*H10D 1/68* (2025.01)

(52) U.S. Cl.
CPC ............ *H10B 51/30* (2023.02); *H10B 51/00* (2023.02); *H10D 1/696* (2025.01); *H01L 2924/1441* (2013.01)

(58) Field of Classification Search
CPC ................ H01L 27/1203; H01L 28/75; H01L 2924/1441; H10B 51/00; H10B 51/30; H10D 1/696
See application file for complete search history.

(56) References Cited

U.S. PATENT DOCUMENTS 6,151,240 A * 11/2000 Suzuki .................... H01L 28/75
257/295
7,297,999 B1 * 11/2007 Wang .................... H10B 53/30
257/306

(Continued)

FOREIGN PATENT DOCUMENTS

| CN | 114388513 A * | 4/2022 | ........ H01L 27/11519 |
| JP | 2002353421 A * | 12/2002 | ........... H01L 27/105 |
| WO | WO-2020105877 A1 * | 5/2020 | ........... G11C 11/161 |

OTHER PUBLICATIONS

Notice of Allowance dated Oct. 5, 2023 for U.S. Appl. No. 17/394,757.

(Continued)

*Primary Examiner* — Matthew E Warren
(74) *Attorney, Agent, or Firm* — Eschweiler & Potashnik, LLC

(57) ABSTRACT

An integrated chip including a semiconductor layer over a substrate. A pair of source/drains are arranged along the semiconductor layer. A first metal layer is over the substrate. A second metal layer is over the first metal layer. A ferroelectric layer is over the second metal layer. The first metal layer has a first crystal orientation and the second metal layer has a second crystal orientation different from the first crystal orientation.

20 Claims, 17 Drawing Sheets

(56) References Cited

U.S. PATENT DOCUMENTS

| | | | | |
|---|---|---|---|---|
| 9,449,979 | B2* | 9/2016 | McKinnon | H10B 53/30 |
| 11,017,830 | B1* | 5/2021 | Lin | H10B 53/30 |
| 2006/0220080 | A1 | 10/2006 | Dubin et al. | |
| 2007/0037298 | A1* | 2/2007 | Matsuura | H01L 28/75 |
| | | | | 438/3 |
| 2008/0212358 | A1* | 9/2008 | Mitsui | H01L 21/76849 |
| | | | | 438/3 |
| 2018/0166453 | A1 | 6/2018 | Mueller et al. | |
| 2020/0357927 | A1* | 11/2020 | Hsieh | H01L 29/66545 |

OTHER PUBLICATIONS

Cao et al. "Effects of Capping Electrode on Ferroelectric Properties of Hf0.5Zr0.5O2 Thin Films" IEEE Electron Device Letters, vol. 39, No. 8, Aug. 2018, published on Jun. 12, 2018.

Lin et al. "3D Scalable, Wake-up Free, and Highly Reliable FRAM Technology with Stress-Engineered HfZrOx" 2019 IEEE International Electron Devices Meeting (IEDM), published on Feb. 13, 2020.

Kashir et al. "Large remnant polarization in a wake-up free Hf0.5Zr0.5O2 ferroelectric film through bulk and interface engineering" CS Appl. Electron. Mater. 2021, 3, 2, 629-638, published on Jan. 20, 2021.

Li et al. "Single and multi-fin normally-off Ga2O3 vertical transistors with a breakdown voltage over 2.6 kV" 2019 IEEE International Electron Devices Meeting (IEDM), published on Feb. 13, 2020.

Non-Final Office Action dated May 24, 2023 for U.S. Appl. No. 17/394,757.

* cited by examiner

Example {100} orientation

Example {110} orientation

Example {111} orientation

3100

| Step | Label |
|---|---|
| Deposit a semiconductor layer over a dielectric layer that is over a substrate. Deposit an insulator layer over the semiconductor layer. Deposit a first metal layer over the insulator layer. Deposit a second metal layer over the first metal layer. Deposit a ferroelectric layer over the second metal layer. Deposit a third metal layer over the ferroelectric layer. Deposit a fourth metal layer over the third metal layer | 3102 |
| Pattern the fourth metal layer, the third metal layer, the ferroelectric layer, the second metal layer, the first metal layer, and the insulator layer to form a multi-layer stack over the semiconductor layer | 3104 |
| Perform an anneal | 3106 |
| Deposit a spacer layer over the semiconductor layer, over the fourth metal layer, and along sidewalls of the multi-layer stack | 3108 |
| Etch the spacer layer to form spacers from the spacer layer | 3110 |
| Deposit a dielectric over the multi-layer stack and over the semiconductor layer | 3112 |
| Pattern the dielectric layer on opposite sides of the multi-layer stack | 3114 |
| Form source/drain regions within the semiconductor layer | 3116 |
| Form source/drain contacts on the source/drain regions within the dielectric layer | 3118 |
| Form metal wires over the source/drain contacts | 3120 |

Fig. 31

FERROELECTRIC MEMORY DEVICE WITH A METAL LAYER HAVING A CRYSTAL ORIENTATION FOR IMPROVING FERROELECTRIC POLARIZATION AND METHOD FOR FORMING THE FERROELECTRIC MEMORY DEVICE

REFERENCE TO RELATED APPLICATION

This application is a Divisional of U.S. application Ser. No. 17/394,757, filed on Aug. 5, 2021, the contents of which are hereby incorporated by reference in their entirety.

BACKGROUND

Many modern day electronic devices contain electronic memory. Electronic memory may be volatile memory or non-volatile memory. Non-volatile memory is able to store data in the absence of power, whereas volatile memory is not. Some examples of next generation electronic memory include ferroelectric random-access memory (FeRAM), magnetoresistive random-access memory (MRAM), resistive random-access memory (RRAM), phase-change random-access memory (PCRAM), and conductive-bridging random-access memory (CBRAM).

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 31 illustrates a flow diagram of some alternative embodiments of a method for forming an integrated chip comprising a first metal layer, a second metal layer on the first metal layer, and a ferroelectric layer on the second metal layer.

DETAILED DESCRIPTION

Figure 1A:
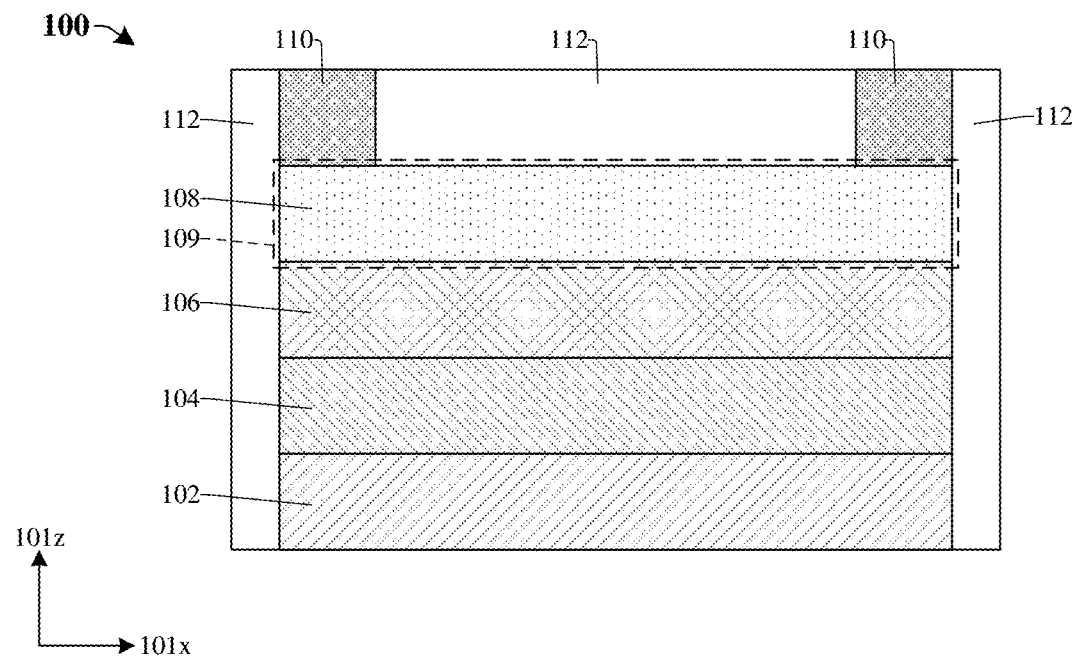
FIG. 1A illustrates a cross-sectional view of some embodiments of an integrated chip comprising a first metal layer, a second metal layer on the first metal layer, and a ferroelectric layer on the second metal layer.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Some integrated chips include memory devices. For example, some integrated chips include ferroelectric random-access memory (FeRAM) devices that include a plurality of FeRAM memory cells. Some FeRAM memory cells include a metal layer over a substrate, a ferroelectric layer on the metal layer, a semiconductor layer on the ferroelectric layer, and a pair of source/drains on the semiconductor layer. A semiconductor channel may extend along the semiconductor layer between the pair of source/drains. The metal layer functions as a gate electrode that is separated from the semiconductor channel by the ferroelectric layer. In some FeRAM devices, the metal layer is deposited over the substrate by a physical vapor deposition process (e.g., a direct current sputtering process) and has a [100] crystal orientation. The ferroelectric layer is then deposited on the metal layer.

The memory cell can be written by applying an electric field to the ferroelectric layer (i.e., by applying a voltage across the ferroelectric layer). When the electric field is applied to the ferroelectric layer, the ferroelectric layer is polarized in a first direction or a second direction, opposite the first direction, depending on the direction of the applied electric field (i.e., depending on the sign of the voltage applied across the ferroelectric layer). The direction of polarization corresponds to the logical state of the cell (e.g., the first direction corresponds to a logical "0" and the second direction corresponds to a logical "1"). A difference between a polarization charge of the ferroelectric layer when it is polarized in the first direction and a polarization charge of the ferroelectric layer when it is polarized in the second direction corresponds to a memory window of the cell. The memory cell can be read by applying an electric field to the ferroelectric layer.

Some ferroelectric layers have four different crystal phases: an orthorhombic phase, a monoclinic phase, a tetragonal phase, and a cubic phase. In some cases, these ferroelectric layers exhibit increased polarization when in the orthorhombic crystal phase. Thus, increasing an orthorhombic phase of a ferroelectric layer (e.g., increasing a volumetric fraction of the ferroelectric layer that is in the orthorhombic phase) may increase a polarization of the ferroelectric layer. In some cases, the orthorhombic phase of the ferroelectric layer can be affected by a tensile stress on the ferroelectric layer. For example, increasing an amount of tensile stress put on the ferroelectric layer (e.g., by neighboring layers) may increase a volumetric fraction of the ferroelectric layer that is in the orthorhombic phase which, in turn, may increase a polarization of the ferroelectric layer.

Polarization can be quantified by a remnant polarization (2Pr) value. Increased polarization can correspond to an increased memory window. An increased memory window can correspond to better memory cell performance (e.g., improved read/write operation performance). Further, increased polarization can correspond to longer device lifetime.

A challenge with these FeRAM devices is that an orthorhombic phase of the ferroelectric layer may be low because the metal layer having the [100] crystal orientation may put little tensile stress on the ferroelectric layer. Thus, an orthorhombic phase of the ferroelectric layer may be reduced (e.g., a volumetric fraction of the ferroelectric layer that is in the orthorhombic phase may be reduced). Reducing the orthorhombic phase of the ferroelectric layer may reduce a polarization (e.g., a remnant polarization (2Pr) value) of the ferroelectric layer. As a result, a memory window and device lifetime may also be reduced.

Various embodiments of the present disclosure are related to an integrated chip comprising a memory cell. The memory cell comprises a first metal layer and a second metal layer under a ferroelectric layer for improving a performance of the integrated chip. A semiconductor layer is over a substrate. A pair of source/drains are arranged along the semiconductor layer. The first metal layer is over the substrate. The second metal layer is over the first metal layer. The ferroelectric layer is on the second metal layer. The second metal layer has a [111] or [110] crystal orientation.

By including the second metal layer in the integrated chip over the first metal layer so the ferroelectric layer is on the second metal layer having the [111] or [110] crystal orientation, a performance of the integrated chip may be improved. For example, the second metal layer may increase a tensile stress put on the ferroelectric layer because the second metal layer has the [111] or [110] crystal orientation. Increasing a tensile stress that is put on the ferroelectric layer may increase an orthorhombic phase of the ferroelectric layer (e.g., may increase a volumetric fraction of the ferroelectric layer that is in the orthorhombic phase). Increasing the orthorhombic phase of the ferroelectric layer may increase a polarization of the ferroelectric layer. Increasing the polarization of the ferroelectric layer may increase a memory window and memory lifetime of the memory cell. In short, by including the second metal layer having [111] or [110] crystal orientation in the integrated chip and under the ferroelectric layer, a performance of the memory cell may be improved.

FIG. 1A illustrates a cross-sectional view 100 of some embodiments of an integrated chip comprising a first metal layer 102, a second metal layer 104 on the first metal layer 102, and a ferroelectric layer 106 on the second metal layer 104.

The second metal layer 104 is on a top surface of the first metal layer 102. The ferroelectric layer 106 is on a top surface of the second metal layer 104. A semiconductor layer 108 is on a top surface of the ferroelectric layer 106. A pair of source/drain structures 110 are arranged along the semiconductor layer 108. In some embodiments, the pair of source/drain structures 110 are on a top surface of the semiconductor layer 108 and are laterally spaced apart. A semiconductor channel 109 may extend along the semiconductor layer 108 between the source/drain structures 110. A dielectric layer 112 is on the top surface of the semiconductor layer 108 and is arranged between the source/drain structures 110. The dielectric layer 112 separates the pair of source/drain structures 110.

In some embodiments, the dielectric layer 112 is on opposite sides of (e.g., on sidewalls of) the first metal layer 102, the second metal layer 104, the ferroelectric layer 106, the semiconductor layer 108, and the source/drain structures 110. In some embodiments, the ferroelectric layer 106 is in direct contact with the second metal layer 104. In some embodiments, the first metal layer 102 and the second metal layer 104 form a gate electrode. In some embodiments, the first metal layer 102, the second metal layer 104, the ferroelectric layer 106, the semiconductor layer 108, and the source/drain structures 110 form a memory cell of the integrated chip.

The aforementioned layers have heights along a z-axis 101z, widths along an x-axis 101x that is perpendicular to the z-axis 101z, and lengths along a y-axis (e.g., 101y of FIG. 1B) that is perpendicular to the z-axis 101z and the x-axis 101x. For example, the aforementioned layers may have top surfaces that are parallel to an x-y plane formed by the x-axis 101x and the y-axis (101y of FIG. 1B).

The first metal layer 102 has a first crystal orientation. The second metal layer 104 has a second crystal orientation different from the first crystal orientation. For example, the first metal layer 102 has a [100] crystal orientation and the second metal layer 104 has a [111] or [110] crystal orientation. In some examples, the aforementioned crystal orientations (e.g., [100], [110], and [111]) correspond to Miller indices.

By including the second metal layer 104 in the integrated chip over the first metal layer 102 so the ferroelectric layer 106 is on the second metal layer 104 having the [111] or [110] crystal orientation, a performance of the integrated chip may be improved. For example, the second metal layer 104 may increase a tensile stress put on the ferroelectric layer 106 because the second metal layer 104 has the [111] or [110] crystal orientation. Increasing the tensile stress that is put on the ferroelectric layer 106 may increase an orthorhombic phase of the ferroelectric layer 106 (e.g., may increase a volumetric fraction of the ferroelectric layer 106 that is in the orthorhombic phase). Increasing the orthorhombic phase of the ferroelectric layer 106 may increase a polarization of the ferroelectric layer 106 and hence may increase a memory window and memory lifetime of the memory cell. Thus, by including the second metal layer 104 having [111] or [110] crystal orientation in the integrated chip, a performance of the integrated chip may be improved.

Figure 1B:
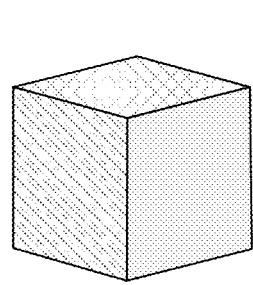
FIG. 1B illustrates some examples of different crystal orientations.
Figure 1B:
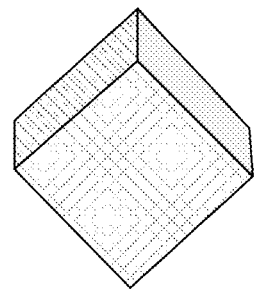
Figure 1B:
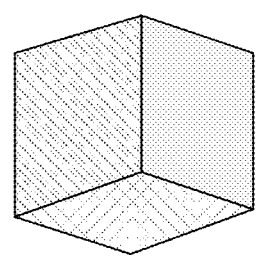

FIG. 1B illustrates some examples of the aforementioned crystal orientations (e.g., [100], [110], and [111]) with respect to the z-axis 101z, the x-axis 101x, and the y-axis 101y. Example crystal lattice orientations are illustrated in FIG. 1B using generic cube shapes. In some examples, a crystal orientation of a layer is described as viewed from above that layer and looking down at that layer along a line that is perpendicular to a top surface of the first metal layer 102. For example, a top surface of the second metal layer 104 may in a plane that is parallel to an x-y plane formed by the x-axis 101x and the y-axis 101y and the crystal orientation of the second metal layer 104 may be described as viewed from above the second metal layer 104 and looking down at second metal layer 104 along the z-axis 101z.

In some instances, a crystal orientation of a layer (e.g., the first metal layer 102 or the second metal layer 104) may be determined by an x-ray diffraction process, a precision electron diffraction process, or some other suitable process.

In some embodiments, the first metal layer 102 comprises a first metal and the second metal layer 104 comprises the first metal. In some other embodiments, the first metal layer 102 comprises a first metal and the second metal layer 104 comprises a second metal different from the first metal. In some embodiments, the first metal layer 102 meets the second metal layer 104 along a grain boundary.

In some embodiments, the first metal layer 102 may comprise platinum, titanium, titanium nitride, tantalum, tantalum nitride, tungsten, iron, nickel, beryllium, chromium, cobalt, antimony, iridium, molybdenum, osmium, thorium, vanadium, some combination of the foregoing metals, or some other suitable material. In some embodiments, the first metal layer 102 may have a thickness of greater than 15 nanometers, greater than 30 nanometers, about 30 nanometers to 1 micrometer, greater than 50 nanometers, or some other suitable thickness.

In some embodiments, increasing a thickness of the first metal layer 102 may increase a thermal capacity of the first metal layer 102. Increasing a thermal capacity of the first metal layer 102 may correspond to an increased tensile stress put on the ferroelectric layer 106. Thus, by increasing the thickness of first metal layer 102, a polarization of the ferroelectric layer 106 may be further increased.

In some embodiments, the second metal layer 104 comprises titanium nitride or some other suitable material. In some embodiments, the second metal layer 104 has a thickness of about 1 nanometer to 100 nanometers or some other suitable thickness. In some embodiments, the ferroelectric layer 106 comprises hafnium-zirconium-oxide (e.g., $Hf_xZr_{1-x}O_y$), scandium doped aluminum nitride, or some other suitable material. In some embodiments, the ferroelectric layer 106 has a thickness of about 30 nanometers or less, or some other suitable thickness.

In some embodiments, the semiconductor layer 108 comprises amorphous indium-gallium-zinc-oxide (e.g., a-IGZO), gallium arsenide, gallium nitride, aluminum gallium arsenide, some indium-gallium-zinc-oxide compound containing tin, some compound semiconductor, amorphous silicon, polycrystalline silicon, or some other suitable material. In some embodiments, the semiconductor layer 108 has a thickness of about 3 nanometers to about 100 nanometers.

In some embodiments, the source/drain structures 110 comprise aluminum, titanium, tantalum, tungsten, ruthenium, gold, copper, some other suitable metal, or some other suitable material. In some embodiments, the dielectric layer 112 comprises silicon dioxide, silicon nitride, or some other suitable dielectric material.

Figure 2:
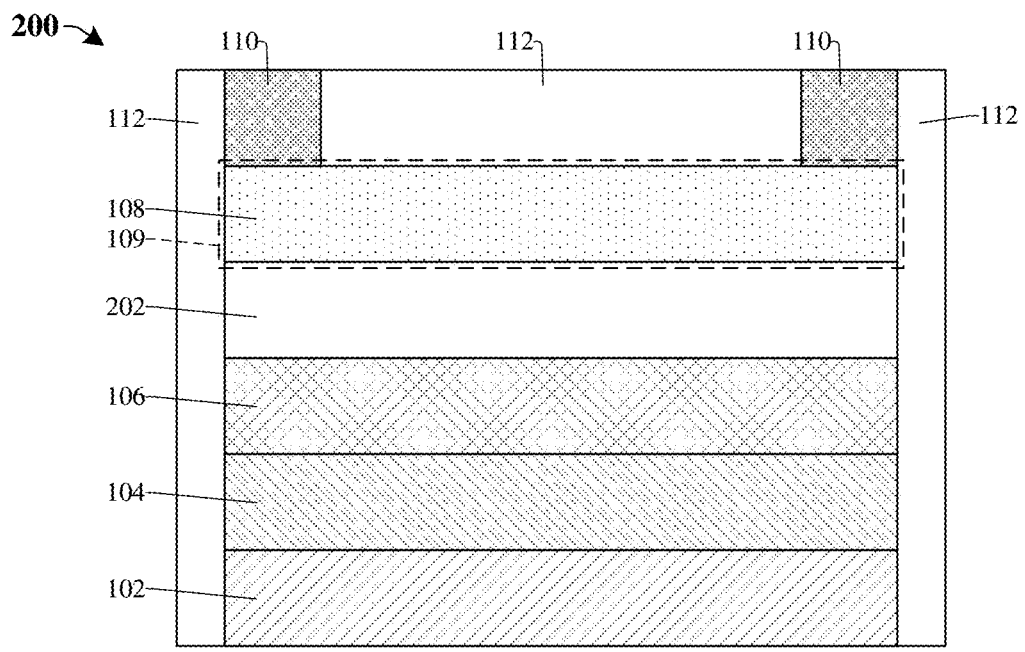
FIG. 2 illustrates a cross-sectional view of some embodiments of the integrated chip of FIG. 1A in which the integrated chip further comprises an insulator layer.

FIG. 2 illustrates a cross-sectional view 200 of some embodiments of the integrated chip of FIG. 1A in which the integrated chip further comprises an insulator layer 202.

The insulator layer 202 is arranged between the ferroelectric layer 106 and the semiconductor layer 108. The insulator layer 202 is on a top surface of the ferroelectric layer 106 and the semiconductor layer 108 is on a top surface of the insulator layer 202.

In some embodiments, the insulator layer 202 comprises silicon dioxide, silicon nitride, hafnium oxide, silicon doped hafnium oxide, or some other suitable material. In some embodiments, the insulator layer 202 has a thickness of about 0.1 nanometers to 10 nanometers or some other suitable thickness.

Figure 3:
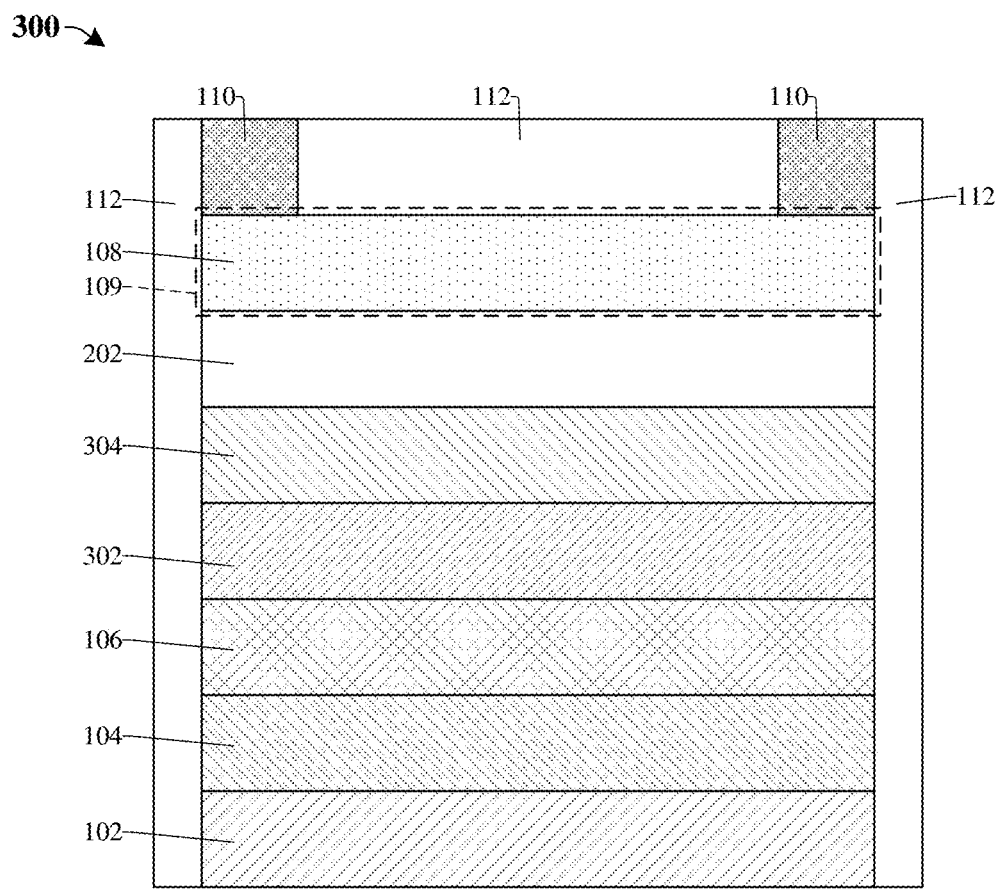
FIG. 3 illustrates a cross-sectional view of some embodiments of the integrated chip of FIG. 2 in which the integrated chip further comprises a third metal layer and a fourth metal layer.

FIG. 3 illustrates a cross-sectional view 300 of some embodiments of the integrated chip of FIG. 2 in which the integrated chip further comprises a third metal layer 302 and a fourth metal layer 304.

The third metal layer 302 and the fourth metal layer 304 are between the ferroelectric layer 106 and the insulator layer 202. The third metal layer 302 is on a top surface of the ferroelectric layer 106. In some embodiments, the third metal layer 302 is in direct contact with the ferroelectric layer 106. The fourth metal layer 304 is on a top surface of the third metal layer 302. The insulator layer 202 is on a top surface of the fourth metal layer 304. In some embodiments, the third metal layer 302 and the fourth metal layer 304 form a floating electrode.

In some embodiments, the third metal layer 302 has a [111] or [110] crystal orientation. In some embodiments, the second metal layer has a [110] crystal orientation and the third metal layer 302 has a [111] crystal orientation, or vice versa. Because the third metal layer 302 has a [111] or [110] crystal orientation and is on the ferroelectric layer 106, the third metal layer 302 may increase a tensile stress put on the ferroelectric layer 106. As a result, a polarization of the ferroelectric layer 106 may be further increased and hence a performance of the integrated chip may be further increased.

In some embodiments, the third metal layer 302 comprises the second metal or a third metal different from the second metal (i.e., the third metal layer 302 may comprise a same or different metal than the second metal layer 104). For example, in some embodiments, the third metal layer 302 comprises titanium nitride or some other suitable material. In some embodiments, the third metal layer 302 has a thickness of about 1 nanometer to 100 nanometers or some other suitable thickness.

In some embodiments, the fourth metal layer 304 comprises the first metal or a fourth metal different from the first metal (i.e., the fourth metal layer 304 may comprise a same or different metal than the first metal layer 102). For example, in some embodiments, the fourth metal layer 304 may comprise platinum, titanium, titanium nitride, tantalum, tantalum nitride, tungsten, iron, nickel, beryllium, chromium, cobalt, antimony, iridium, molybdenum, osmium, thorium, vanadium, some combination of the foregoing metals, or some other suitable material. In some embodiments, the fourth metal layer 304 has a thickness of greater than 15 nanometers, greater than 30 nanometers, about 30 nanometers to 1 micrometer, greater than 50 nanometers, or some other suitable thickness.

In some embodiments, increasing a thickness of the fourth metal layer 304 may increase a thermal capacity of the fourth metal layer 304. Increasing a thermal capacity of the fourth metal layer 304 may correspond to an increased tensile stress put on the ferroelectric layer 106. Thus, by increasing the thickness of fourth metal layer 304, a polarization of the ferroelectric layer 106 may be further increased.

Figure 4:
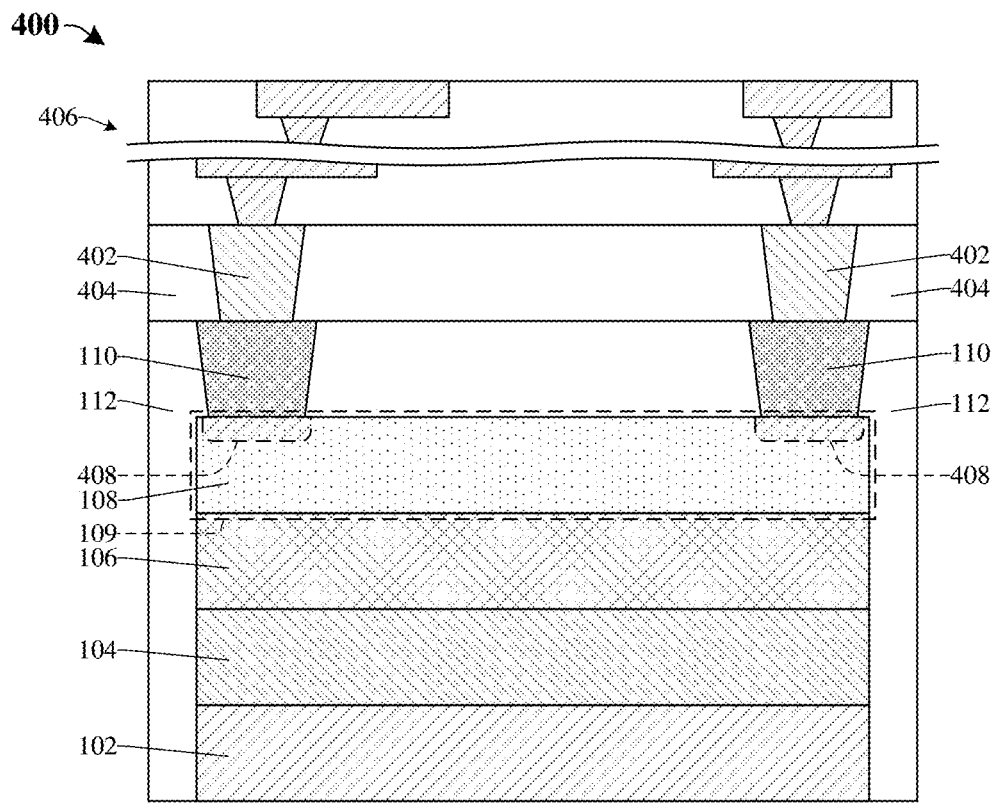
FIG. 4 illustrates a cross-sectional view of some embodiments of the integrated chip of FIG. 1A in which the integrated chip further comprises an interconnect structure.

FIG. 4 illustrates a cross-sectional view 400 of some embodiments of the integrated chip of FIG. 1A in which the integrated chip further comprises an interconnect structure 406.

In some embodiments, a pair of metal wires 402 are within a dielectric layer 404 and on the source/drain structures 110. The interconnect structure 406 is over the metal wires 402. The interconnect structure 406 may comprise additional metal wires (e.g., metal vias, metal lines, or the like) within one or more dielectric layers. The additional metal wires may be coupled to the source/drain structures 110 via the metal wires 402.

In some embodiments, a pair of diffusion regions 408 may exist within the semiconductor layer 108 directly beneath the source/drain structures 110. The diffusion regions 408 may be formed as the metal from the source/drain structures 110 diffuses into the semiconductor layer 108. Thus, the diffusion regions 408 may comprise a combination of a semiconductor material from the semiconductor layer 108 and a metal material from the source/drain structures 110.

Figure 5:
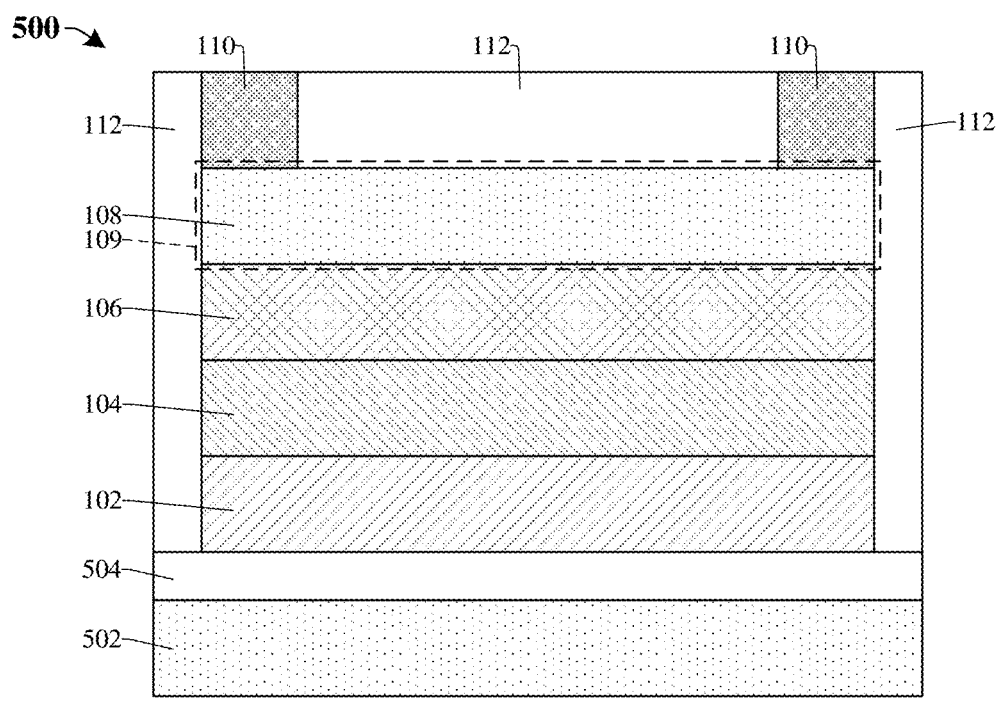
FIG. 5 illustrates a cross-sectional view of some embodiments of the integrated chip of FIG. 1A in which the first metal layer is over a substrate.

FIG. 5 illustrates a cross-sectional view 500 of some embodiments of the integrated chip of FIG. 1A in which the first metal layer 102 is over a substrate 502.

In some embodiments, a dielectric layer 504 is on the substrate 502 and the first metal layer 102 is on a top surface of the dielectric layer 504. In some embodiments, the substrate 502 comprises silicon or some other suitable material and the dielectric layer 504 comprises silicon dioxide, silicon nitride, or some other suitable material.

Figure 6:
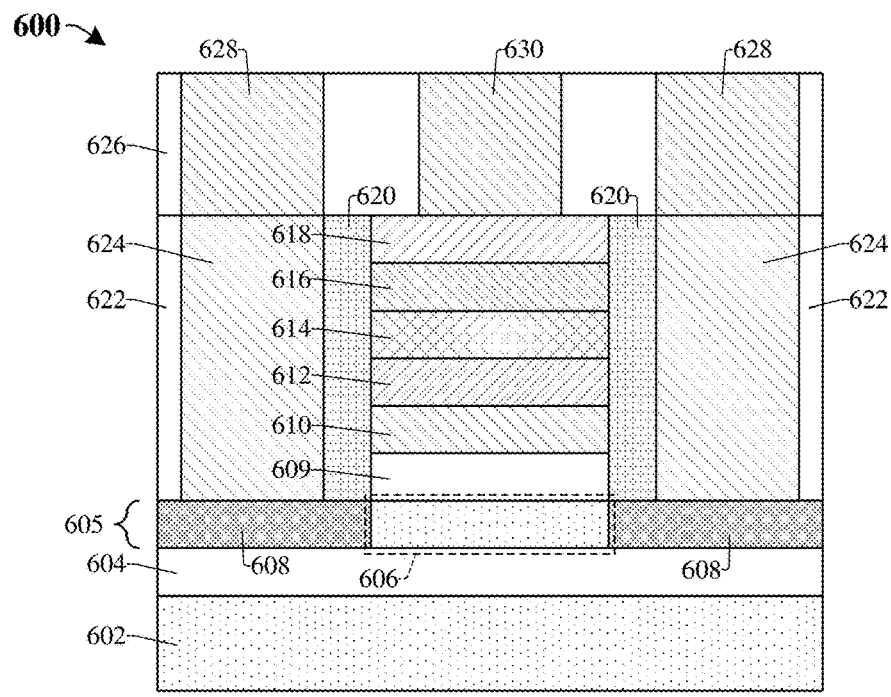
FIGS. 6 and 7 illustrate cross-sectional views of some alternative embodiments of an integrated chip comprising a first metal layer, a second metal layer on the first metal layer, and a ferroelectric layer on the second metal layer.

FIG. 6 illustrates a cross-sectional view 600 of some alternative embodiments of an integrated chip comprising a first metal layer 610, a second metal layer 612 on the first metal layer 610, and a ferroelectric layer 614 on the second metal layer 612.

The integrated chip comprises a dielectric layer 604 over a substrate 602. A semiconductor layer 605 is on a top surface of the dielectric layer 604. A pair of source/drain regions 608 are within the semiconductor layer 605. The pair of source/drain regions 608 are arranged along the semiconductor layer 605. The pair of source/drain regions 608 are doped regions of the semiconductor layer 605. A doping type of the pair of source/drain regions 608 may be opposite that of the semiconductor layer 605. A semiconductor channel 606 may extend along a portion of the semiconductor layer 605 that extends between the source/drain regions 608. An insulator layer 609 is directly over the semiconductor layer 605 on a top surface of the semiconductor layer 605. A first metal layer 610 is on a top surface of the insulator layer 609. A second metal layer 612 is on a top surface of the first metal layer 610. A ferroelectric layer 614 is on a top surface of the second metal layer 612. A third metal layer 616 is on a top surface of the ferroelectric layer 614. A fourth metal layer 618 is on a top surface of the third metal layer 616. Spacers 620 line opposing sidewalls of the insulator layer 609, the first metal layer 610, the second metal layer 612, the ferroelectric layer 614, the third metal layer 616, and the fourth metal layer 618. In some embodiments, the spacers 620 comprise a dielectric material.

A dielectric layer 622 is over the source/drain regions 608. A pair of source/drain contacts 624 are within in the dielectric layer 622 and on the source/drain regions 608. The source/drain contacts 624 extend vertically through the dielectric layer 622 and along sidewalls of the spacers 620. The spacers 620 laterally separate the source/drain contacts 624 from the sidewalls of the insulator layer 609, the first metal layer 610, the second metal layer 612, the ferroelectric layer 614, the third metal layer 616, and the fourth metal layer 618.

A dielectric layer 626 is over the dielectric layer 622. First metal wires 628 are within the dielectric layer 626 and on the source/drain contacts 624. A second metal wire 630 is within the dielectric layer 626 and on a top surface of the fourth metal layer 618.

As discussed with regard to FIG. 1A and FIG. 3, the second metal layer 612 and the third metal layer 616 have a [110] or [111] crystal orientation. As a result, a tensile stress on the ferroelectric layer 614 may be increased and hence a polarization of the ferroelectric layer 614 may be increased. In addition, the first metal layer 610 and the fourth metal layer 618 may have relatively large thicknesses (e.g., greater than about 30 nanometers, greater than about 50 nanometers, or the like). As a result, a tensile stress on the ferroelectric layer 614 may be further increased and hence a polarization of the ferroelectric layer 614 may be further increased.

In some embodiments, the dielectric layer 604 may be referred to as a buffer layer, the insulator layer 609 may be referred to as a blocking layer, the first metal layer 610 and/or the second metal layer 612 may be referred to as a floating electrode, and the third metal layer 616 and/or the fourth metal layer 618 may be referred to as a gate electrode.

Figure 7:
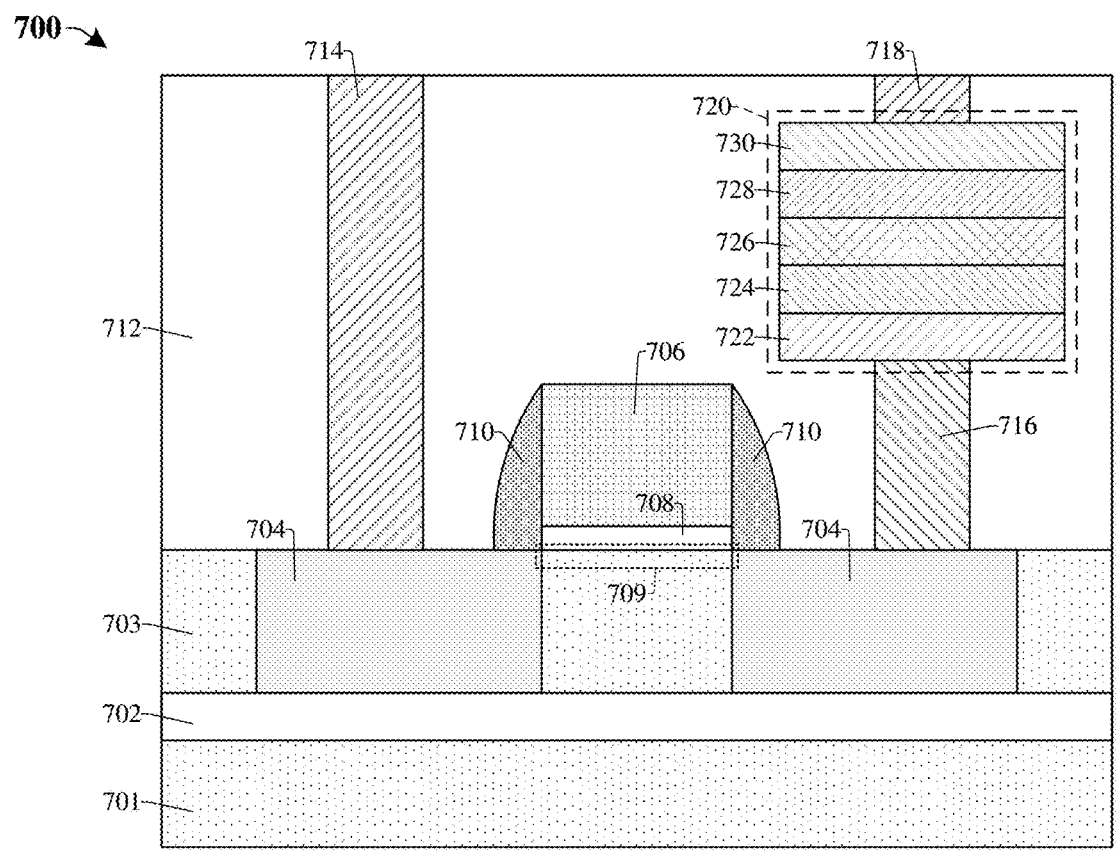

FIG. 7 illustrates a cross-sectional view 700 of some alternative embodiments of an integrated chip comprising a first metal layer 722, a second metal layer 724 on the first metal layer 722, and a ferroelectric layer 726 on the second metal layer 724.

The integrated chip comprises a dielectric layer 702 over a substrate 701 and a semiconductor layer 703 over the dielectric layer 702. A pair of source/drain regions 704 are disposed within the semiconductor layer 703. The source/drain regions 704 are arranged along the semiconductor layer 703. The source/drain regions 704 are doped regions of the semiconductor layer 703. The source/drain regions 704 may have a doping type opposite that of the semiconductor layer 703. A gate structure 706 is over the semiconductor layer 703 and is vertically separated from the semiconductor layer 703 by a gate dielectric layer 708. The gate structure 706 extends over the semiconductor layer 703 between the source/drain regions 704. A semiconductor channel 709 may extend along a top surface of the semiconductor layer 703 and along the gate dielectric layer 708 between the source/drain regions 704. In some embodiments, spacers 710 are on opposing sidewalls of the gate structure 706 and the gate dielectric layer 708. A dielectric structure 712 is over the substrate 701 and comprises one or more dielectric layers. A first metal wire 714 extends vertically through the dielectric structure 712 to a top surface of one of the source/drain regions and a second metal wire 716 extends vertically through the dielectric structure 712 to a top surface of the other of the source/drain regions.

A ferroelectric memory stack 720 is arranged over the substrate 701 and on a top surface of the second metal wire 716. The ferroelectric memory stack 720 is within the dielectric structure 712 and comprises a first metal layer 722, a second metal layer 724 on the first metal layer 722, a ferroelectric layer 726 on the second metal layer 724, a third metal layer 728 on the ferroelectric layer 726, and a fourth metal layer 730 on the third metal layer 728.

A third metal wire 718 is on the fourth metal layer 730. In some embodiments, the first metal wire 714 is a bit line and the second metal wire 716 and the third metal wire 718 together form a source line with the ferroelectric memory stack 720 arranged in series between the second metal wire 716 and the third metal wire 718. In some embodiments, a fourth metal wire (not shown) is coupled to the gate structure 706 and is a word line.

As discussed with regard to FIG. 1A, FIG. 3, and FIG. 6, the second metal layer 724 and the third metal layer 728 have a [110] or [111] crystal orientation. As a result, a tensile stress put on the ferroelectric layer 726 may be increased and hence a polarization of the ferroelectric layer 726 may be increased. In addition, the first metal layer 722 and the fourth metal layer 730 may have relatively large thicknesses (e.g., greater than about 30 nanometers, greater than about 50 nanometers, or the like). As a result, a tensile stress on the ferroelectric layer 726 may be further increased and hence a polarization of the ferroelectric layer 726 may be further increased.

FIGS. 8-19 illustrate cross-sectional views 800-1900 of some embodiments of a method for forming an integrated chip comprising a first metal layer 102, a second metal layer 104 on the first metal layer 102, and a ferroelectric layer 106 on the second metal layer 104. Although FIGS. 8-19 are described in relation to a method, it will be appreciated that the structures disclosed in FIGS. 8-19 are not limited to such a method, but instead may stand alone as structures independent of the method.

Figure 8:
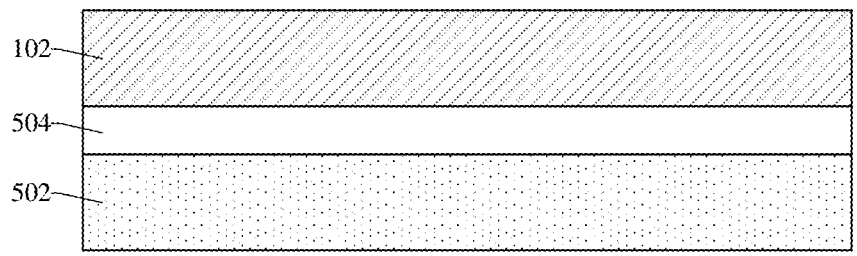
FIGS. 8-19 illustrate cross-sectional views of some embodiments of a method for forming an integrated chip comprising a first metal layer, a second metal layer on the first metal layer, and a ferroelectric layer on the second metal layer.

As shown in cross-sectional view 800 of FIG. 8, a first metal layer 102 is formed over a substrate 502. In some embodiments, the first metal layer 102 is deposited on a dielectric layer 504 that is over the substrate 502. In some embodiments, the first metal layer 102 is formed by depositing platinum, titanium, titanium nitride, tantalum, tantalum nitride, tungsten, iron, nickel, beryllium, chromium, cobalt, antimony, iridium, molybdenum, osmium, thorium, vanadium, some combination of the foregoing metals, or some other suitable material over the substrate 502 by a physical vapor deposition (PVD) process, a chemical vapor deposition (CVD) process, an atomic layer deposition (ALD) process, a pulsed laser deposition (PLD) process, or some other suitable process. In some embodiments, the first metal layer 102 is formed to have a thickness of greater than 30 nanometers, greater than 50 nanometers, or some other suitable thickness.

Figure 9:
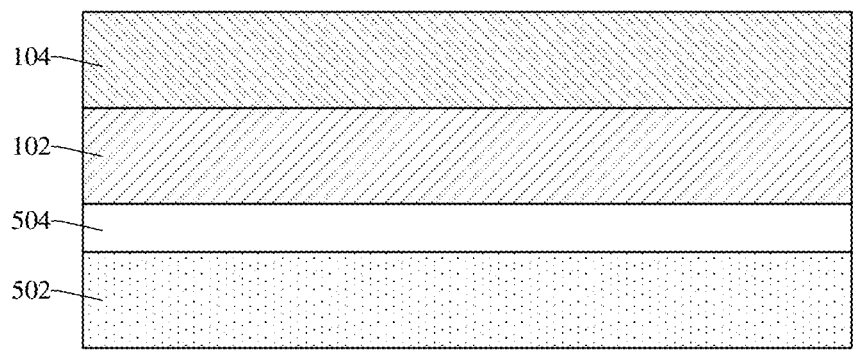

As shown in cross-sectional view 900 of FIG. 9, a second metal layer 104 is formed on the first metal layer 102. The second metal layer is formed on the first metal layer 102 to have a [111] or [110] crystal orientation. In some embodiments, the second metal layer 104 is formed by depositing titanium nitride or some other suitable material over the first metal layer 102 by a plasma-enhanced ALD (PEALD) process, a PLD process, or some other suitable process. In some instances, by controlling an amount of power utilized in the PEALD process or the PLD process, a crystal orientation of the second metal layer 104 may be controlled. In some embodiments, the power may range from about 500 watts to about 2000 watts or some other suitable range.

Figure 10:
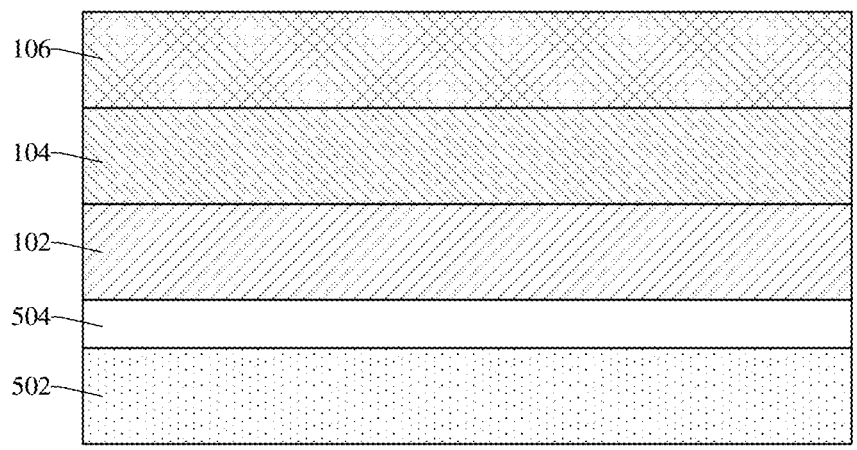

As shown in cross-sectional view 1000 of FIG. 10, a ferroelectric layer 106 is formed on the second metal layer 104. In some embodiments, the ferroelectric layer 106 is formed by depositing hafnium-zirconium-oxide (e.g., $Hf_xZr_{1-x}O_y$), scandium doped aluminum nitride, or some other suitable material over the second metal layer 104 by a CVD process, a PVD process, an ALD process, or some other suitable process.

In some embodiments, an anneal is performed after the ferroelectric layer 106 is formed on the second metal layer 104. For example, the ferroelectric layer 106, the second metal layer 104, the first metal layer 102, the dielectric layer 504, and the substrate 502 are annealed by a first anneal process after the ferroelectric layer 106 is deposited. The first anneal process may, for example, comprise a rapid thermal anneal (RTA) process (e.g., heating the layers in an environment of about 350 to 700 degrees Celsius or some other suitable temperature for about 10 to 30 seconds or some other suitable time), a furnace anneal process (e.g., heating the layers in an environment of about 350 to 700 degrees Celsius or some other suitable temperature for about 30 seconds to 5 hours or some other suitable time), or some other suitable anneal process.

Figure 11:
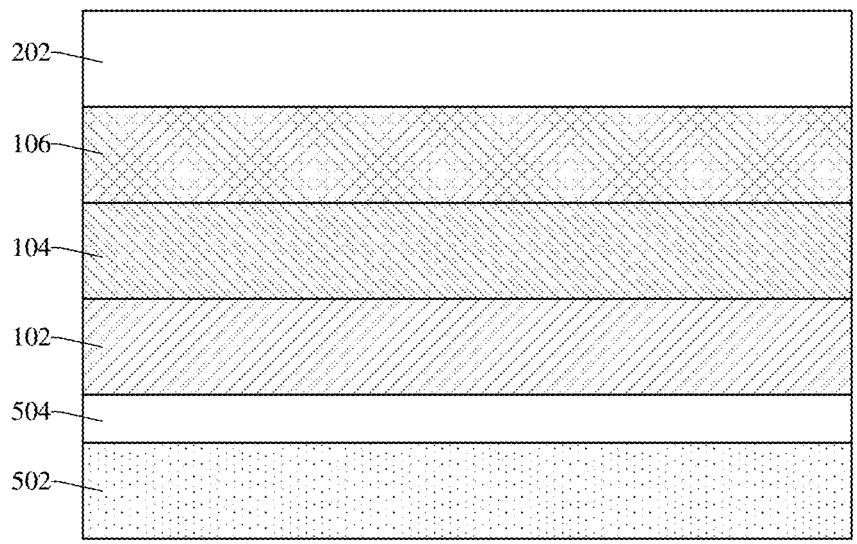
Figure 12:
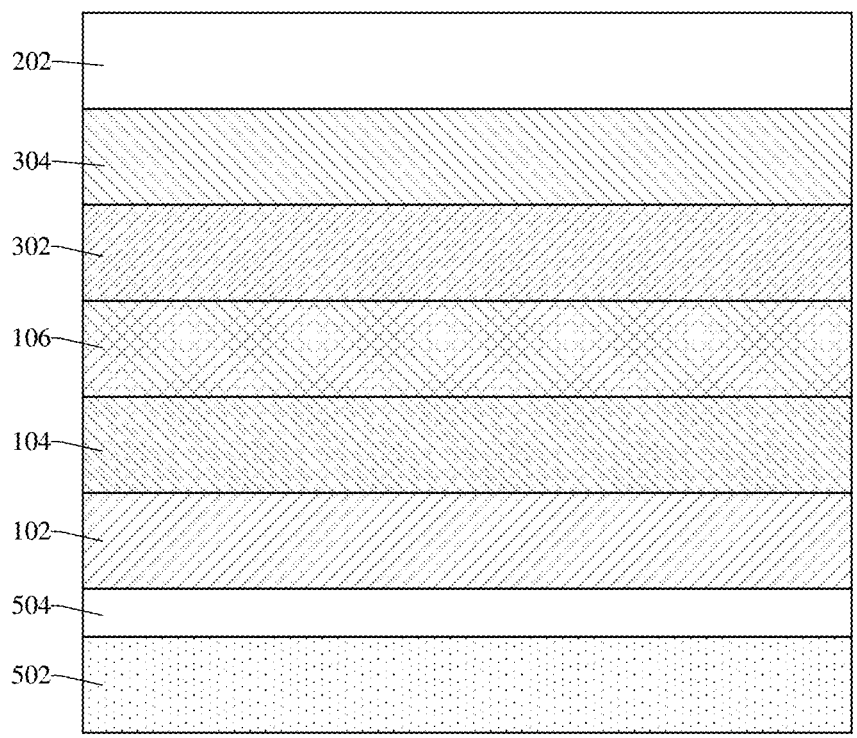

FIG. 11 and FIG. 12 illustrate examples of two alternative portions of the method for forming the integrated chip.

In some embodiments, as shown in cross-sectional view 1100 of FIG. 11, an insulator layer 202 is formed on the ferroelectric layer 106. In some embodiments, the insulator layer 202 is formed by depositing silicon dioxide, silicon nitride, hafnium oxide, silicon doped hafnium oxide, or some other suitable material over the ferroelectric layer 106 by a CVD process, a PVD process, an ALD process, or some other suitable process.

In some other embodiments, as shown in cross-sectional view 1200 of FIG. 12, a third metal layer 302 is formed on the ferroelectric layer 106, a fourth metal layer 304 is formed on the third metal layer 302, and an insulator layer 202 is formed on the fourth metal layer 304. The third metal layer 302 is formed on the ferroelectric layer 106 to have a [111] or [110] crystal orientation.

In some embodiments, the third metal layer 302 is formed by depositing titanium nitride or some other suitable material over the ferroelectric layer 106 by a PEALD process, a PLD process, or some other suitable process.

In some embodiments, forming the fourth metal layer 304 comprises depositing platinum, titanium, titanium nitride, tantalum, tantalum nitride, tungsten, iron, nickel, beryllium, chromium, cobalt, antimony, iridium, molybdenum, osmium, thorium, vanadium, some combination of the foregoing metals, or some other suitable material over the third metal layer 302 by a PVD process, a CVD process, an ALD process, a PLD process, or some other suitable process.

Figure 13:
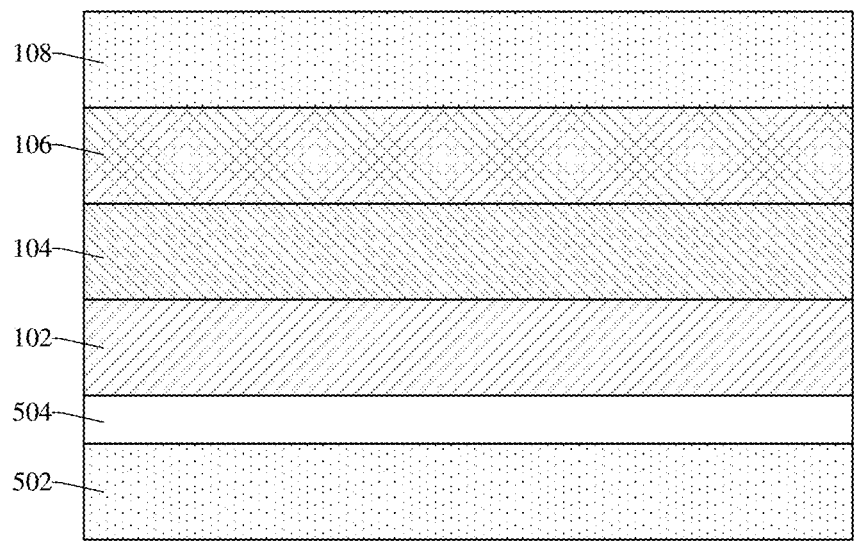

FIG. 13 and subsequent figures are illustrated as if the processes illustrated in FIGS. 11 and 12 were not performed. As shown in cross-sectional view 1300 of FIG. 13, a semiconductor layer 108 is formed on the ferroelectric layer 106. In some embodiments, the semiconductor layer 108 is formed by depositing amorphous indium-gallium-zinc-oxide (e.g., a-IGZO), gallium arsenide, gallium nitride, aluminum gallium arsenide, some indium-gallium-zinc-oxide compound containing tin, some compound semiconductor, amorphous silicon, polycrystalline silicon, or some other suitable material over the ferroelectric layer 106 by a CVD process, a PVD process, an ALD process, or some other suitable process.

In some other embodiments (e.g., in some embodiments where the insulator layer 202 is formed on the ferroelectric layer 106, as shown in FIG. 11), the semiconductor layer 108 is formed on the insulator layer 202 that is over the ferroelectric layer 106.

In some other embodiments (e.g., in some embodiments where the third metal layer 302 is formed on the ferroelectric layer 106, the fourth metal layer 304 is formed on the third metal layer 302, and the insulator layer 202 is formed on the fourth metal layer 304, as shown in FIG. 12), the semiconductor layer 108 is formed on the insulator layer 202 that is over the third metal layer 302 and the fourth metal layer 304.

In some embodiments, an anneal is performed after the semiconductor layer 108 is formed. For example, the semiconductor layer 108, the ferroelectric layer 106, the second metal layer 104, the first metal layer 102, the dielectric layer 504, and the substrate 502 (and possibly the third metal layer 302, the fourth metal layer 304, and/or the insulator layer 202) are annealed by a second anneal process after the semiconductor layer 108 is deposited. The second anneal process may, for example, comprise an RTA process, a furnace anneal process, or some other suitable anneal process.

In some embodiments, the method comprises the first anneal process and not the second anneal process. In some other embodiments, the method comprises the second anneal process and not the first anneal process. In some other embodiments, the method comprises both the first and second anneal processes. In some instances, the first anneal and/or the second anneal may further increase a tensile stress put on the ferroelectric layer 106 and hence may increase a polarization of the ferroelectric layer 106.

Figure 14:
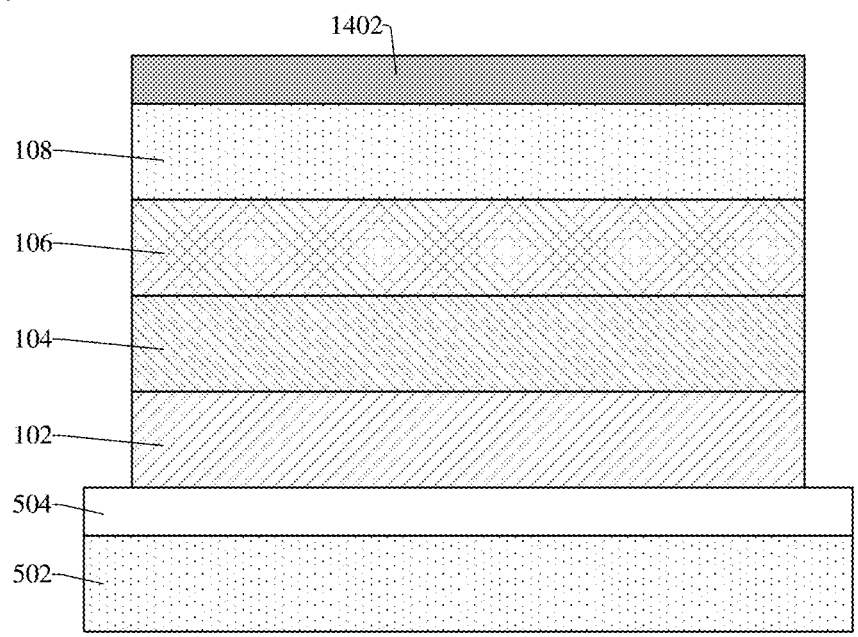

As shown in cross-sectional view 1400 of FIG. 14, a masking layer 1402 is formed over the substrate 502. The semiconductor layer 108, the ferroelectric layer 106, the second metal layer 104, and the first metal layer 102 are then patterned according to the masking layer 1402 to form a multi-layer stack. In some embodiments, the patterning may comprise a dry etching process such as, for example, a reactive ion etching (RIE) process, an ion beam etching (IBE) process, or some other suitable process. In some embodiments, the masking layer 1402 may comprise a photoresist mask, a hard mask, or some other suitable mask. The masking layer 1402 may be removed after the patterning.

Figure 15:
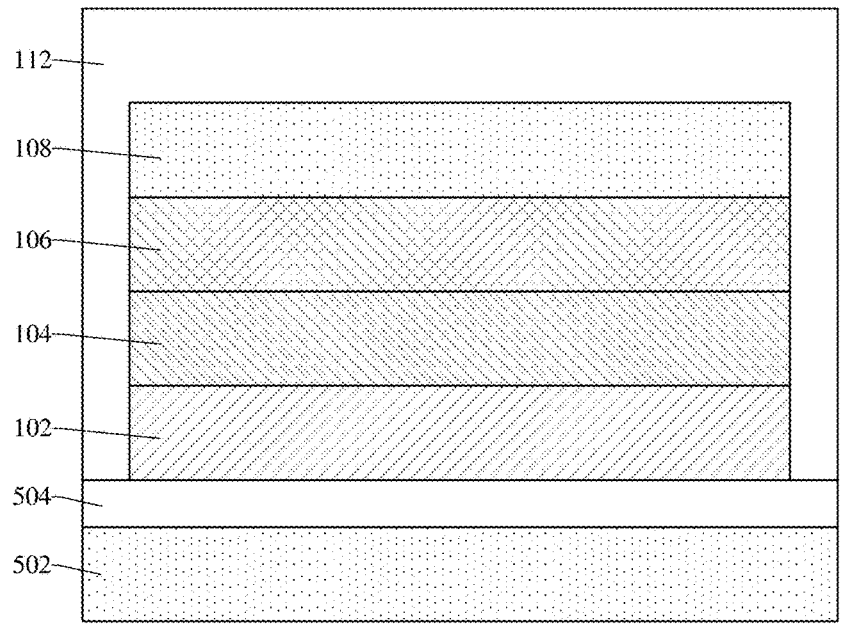

As shown in cross-sectional view 1500 of FIG. 15, a dielectric layer 112 is formed over the substrate 502 on a top surface of the semiconductor layer 108 and on opposing sidewalls of the semiconductor layer 108, the ferroelectric layer 106, the second metal layer 104, and the first metal layer 102. In some embodiments, forming the dielectric layer 112 comprises depositing silicon dioxide, silicon nitride, or some other suitable material over the substrate 502 by a CVD process, a PVD process, an ALD process, or some other suitable process.

Figure 16:
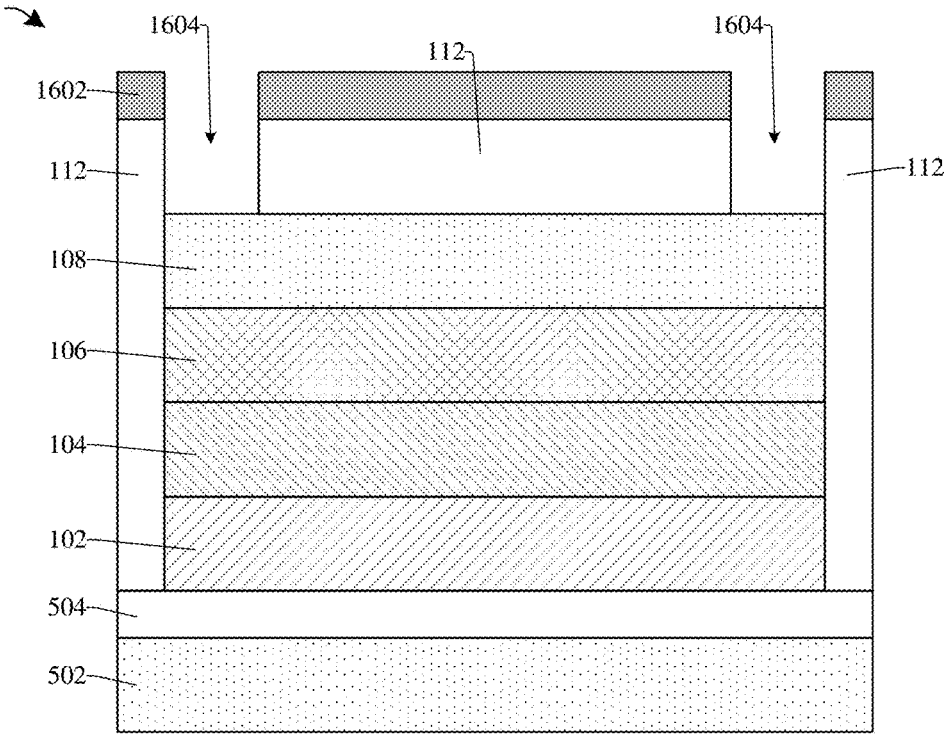

As shown in cross-sectional view 1600 of FIG. 16, a masking layer 1602 is formed over the substrate 602. The dielectric layer 112 is then patterned according to the masking layer 1602 to form openings 1604 over the semiconductor layer 108. The openings 1604 uncover portions of the top surface of the semiconductor layer 108 on opposite ends of the top surface. In some embodiments, the patterning may comprise a dry etching process or some other suitable etching process. In some embodiments, the masking layer 1602 may comprise a photoresist mask, a hard mask, or some other suitable mask. The masking layer 1602 may be removed after the patterning.

Figure 17:
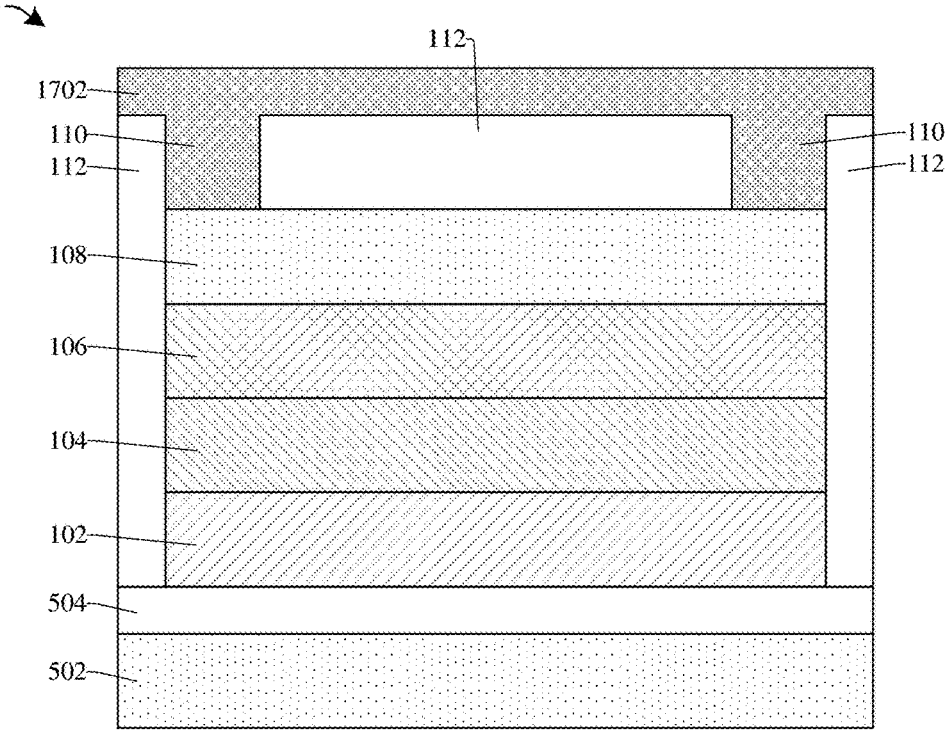

As shown in cross-sectional view 1700 of FIG. 17, a metal layer 1702 is deposited over dielectric layer 112 and in the openings (1604 of FIG. 16) to form source/drain structures 110 in place of the openings. In some embodiments, the metal layer 1702 comprises aluminum, titanium, tantalum, tungsten, ruthenium, gold, copper, some other suitable metal and is deposited by a CVD process, a PVD process, an ALD process, or some other suitable process.

Figure 18:
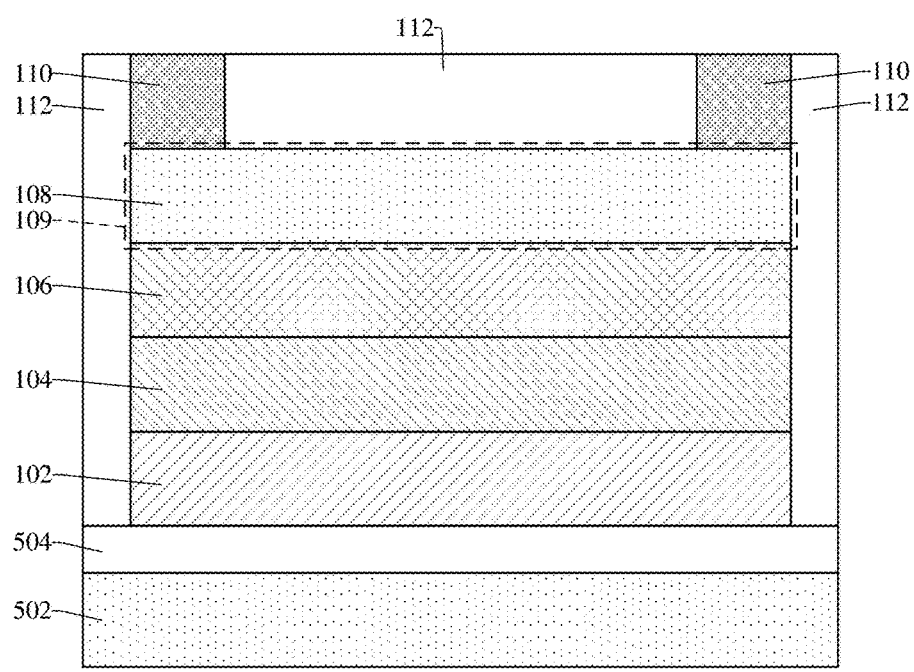

As shown in cross-sectional view 1800 of FIG. 18, a planarization process is performed on the metal layer (1702 of FIG. 17) and the dielectric layer 112. The planarization process may remove the metal layer from over the dielectric layer 112. In some embodiments, top surfaces of the source/drain structures 110 and top surfaces of the dielectric layer 112 may be coplanar after the planarization process is performed. The planarization process further forms the source/drain structures 110. In some embodiments, the planarization process may, for example, comprise a chemical mechanical planarization (CMP) or some other suitable planarization process. In addition, a semiconductor channel 109 may extend along the portion of semiconductor layer 108 that extends between the source/drain structures 110.

Figure 19:
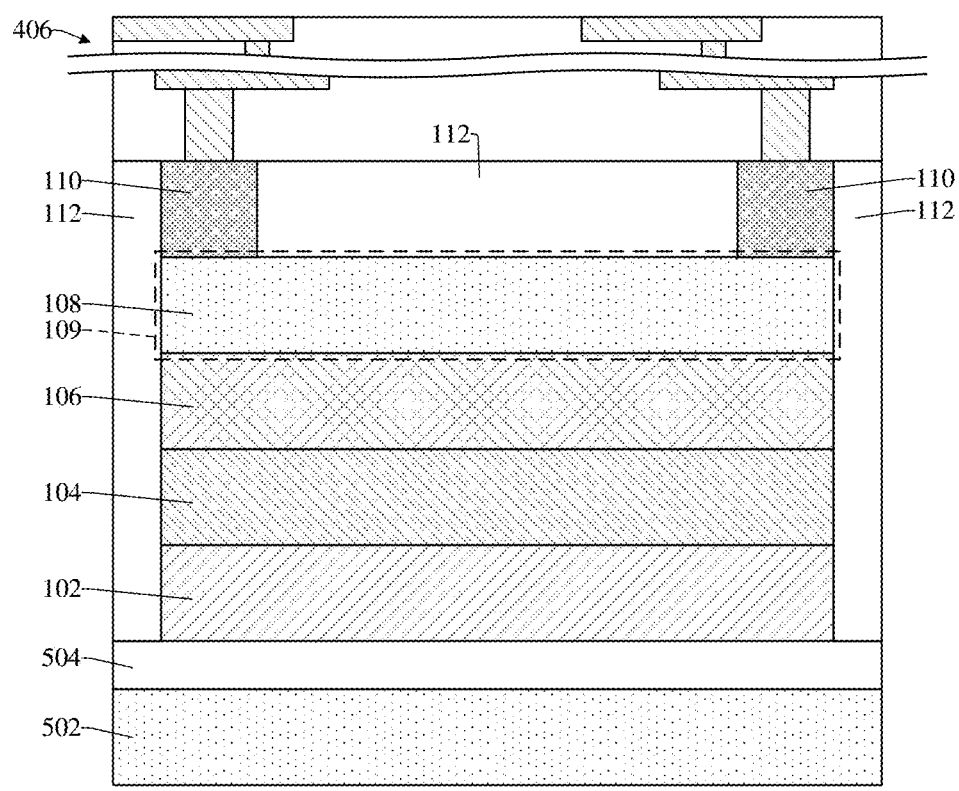

As shown in cross-sectional view 1900 of FIG. 19, an interconnect structure 406 comprising a plurality of wires (e.g., metal lines, metal vias, or the like) disposed within one or more dielectric layers is formed over the source/drain structures 110. In some embodiments, forming the interconnect structure 406 comprises one or more dielectric deposition processes, one or more dielectric patterning processes, one or more metal deposition processes, one or more planarization process, and/or some other suitable processes.

Figure 20:
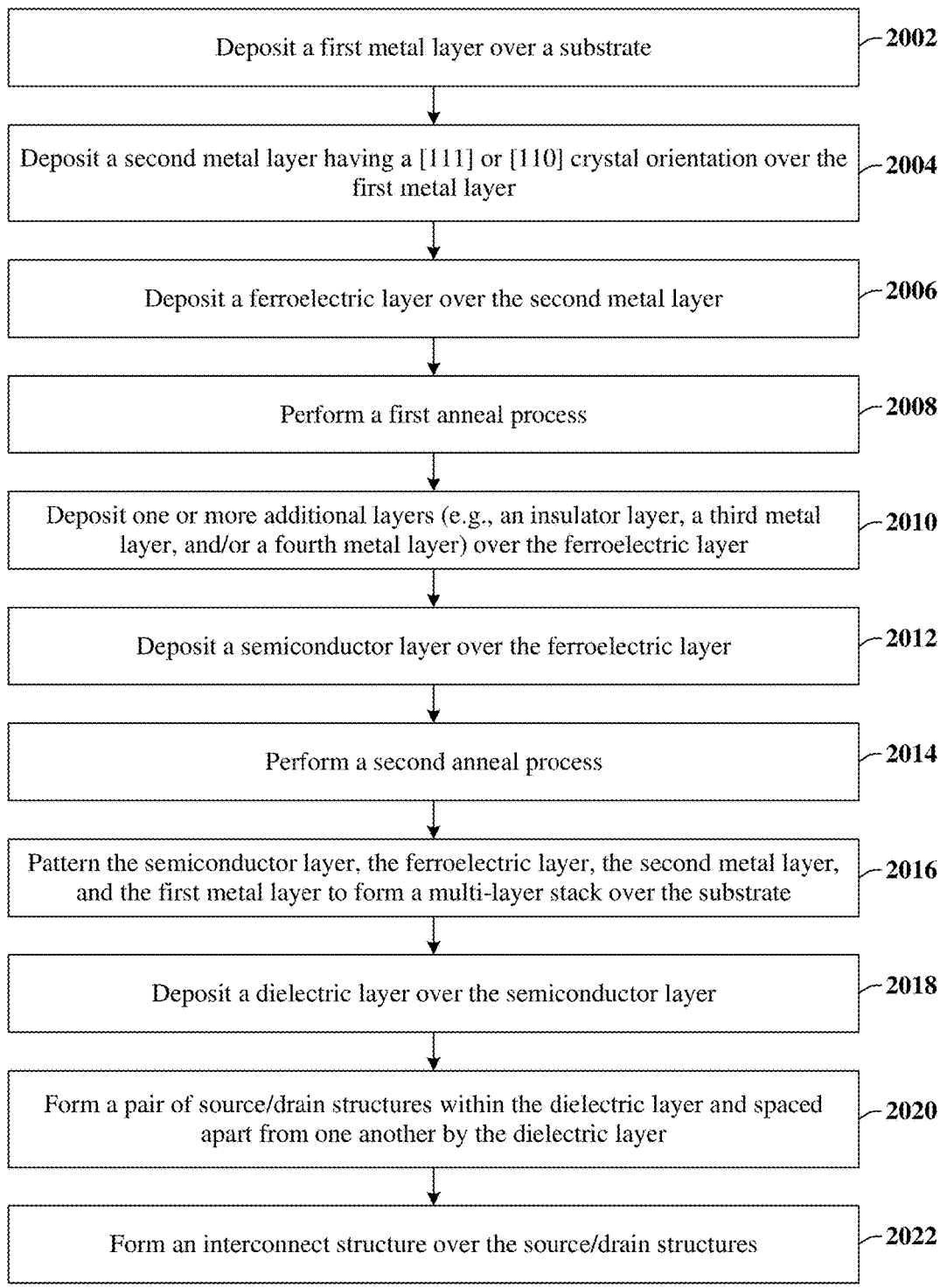
FIG. 20 illustrates a flow diagram of some embodiments of a method for forming an integrated chip comprising a first metal layer, a second metal layer on the first metal layer, and a ferroelectric layer on the second metal layer.

FIG. 20 illustrates a flow diagram of some embodiments of a method 2000 for forming an integrated chip comprising a first metal layer, a second metal layer on the first metal layer, and a ferroelectric layer on the second metal layer. While method 2000 is illustrated and described below as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

At 2002, deposit a first metal layer over a substrate. FIG. 8 illustrates a cross-sectional view 800 of some embodiments corresponding to act 2002.

At 2004, deposit a second metal layer having a [111] or [110] crystal orientation over the first metal layer. FIG. 9 illustrates a cross-sectional view 900 of some embodiments corresponding to act 2004.

At 2006, deposit a ferroelectric layer over the second metal layer. FIG. 10 illustrates a cross-sectional view 1000 of some embodiments corresponding to act 2006.

At 2008, perform a first anneal process (e.g., as described with regard to FIG. 10).

At 2010, deposit one or more additional layers (e.g., an insulator layer, a third metal layer, and/or a fourth metal layer) over the ferroelectric layer. FIGS. 11 and 12 illustrate cross-sectional views 1100 and 1200 of some embodiments corresponding to act 2010.

At 2012, deposit a semiconductor layer over the ferroelectric layer. FIG. 13 illustrates a cross-sectional view 1300 of some embodiments corresponding to act 2012.

At 2014, perform a second anneal process (e.g., as described with regard to FIG. 13).

At 2016, pattern the semiconductor layer, the ferroelectric layer, the second metal layer, and the first metal layer to form a multi-layer stack over the substrate. FIG. 14 illustrates a cross-sectional view 1400 of some embodiments corresponding to act 2016.

At 2018, deposit a dielectric layer over the semiconductor layer. FIG. 15 illustrates a cross-sectional view 1500 of some embodiments corresponding to act 2018.

At 2020, form a pair of source/drain structures within the dielectric layer and spaced apart from one another by the dielectric layer. In some cases, a semiconductor channel may extend along a portion of the semiconductor layer that extends between the source/drain structures. FIGS. 16, 17, and 18 illustrate cross-sectional views 1600, 1700, and 1800 of some embodiments corresponding to act 2020.

At 2022, form an interconnect structure over the source/drain structures. FIG. 19 illustrates a cross-sectional view 1900 of some embodiments corresponding to act 2022.

FIGS. 21-30 illustrate cross-sectional views 2100-3000 of some alternative embodiments of a method for forming an integrated chip comprising a first metal layer 610, a second metal layer 612 on the first metal layer 610, and a ferroelectric layer 614 on the second metal layer 612. Although FIGS. 21-30 are described in relation to a method, it will be appreciated that the structures disclosed in FIGS. 21-30 are not limited to such a method, but instead may stand alone as structures independent of the method.

Figure 21:
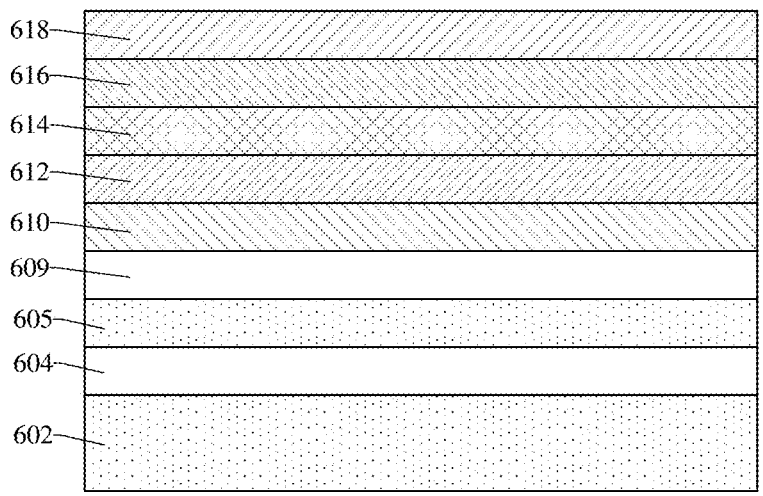
FIGS. 21-30 illustrate cross-sectional views of some alternative embodiments of a method for forming an integrated chip comprising a first metal layer, a second metal layer on the first metal layer, and a ferroelectric layer on the second metal layer.

As shown in cross-sectional view 2100 of FIG. 21, a semiconductor layer 605 is formed on a dielectric layer 604 that is over a substrate 602. An insulator layer 609 is formed on the semiconductor layer 605. A first metal layer 610 is formed on the insulator layer 609. A second metal layer 612 is formed on the first metal layer 610. A ferroelectric layer 614 is formed on the second metal layer 612. A third metal layer 616 is formed on the ferroelectric layer 614. A fourth metal layer 618 is formed on the third metal layer 616.

In some embodiments, the semiconductor layer 605 is formed by depositing amorphous indium-gallium-zinc-oxide (e.g., a-IGZO), gallium arsenide, gallium nitride, aluminum gallium arsenide, some indium-gallium-zinc-oxide compound containing tin, some compound semiconductor, amorphous silicon, polycrystalline silicon, or some other suitable material over the dielectric layer 604 by a CVD process, a PVD process, an ALD process, or some other suitable process. In some embodiments, the insulator layer 609 is formed by depositing silicon dioxide, silicon nitride, hafnium oxide, silicon doped hafnium oxide, or some other suitable material over the semiconductor layer 605 by a CVD process, a PVD process, an ALD process, or some other suitable process.

In some embodiments, the first metal layer 610 is formed by depositing platinum, titanium, titanium nitride, tantalum, tantalum nitride, tungsten, iron, nickel, beryllium, chromium, cobalt, antimony, iridium, molybdenum, osmium, thorium, vanadium, some other suitable combination of the foregoing metals, or some other suitable material over the insulator layer 609 by a CVD process, a PVD process, an ALD process, a PLD process, or some other suitable process. In some embodiments, the first metal layer 610 is formed to have a thickness of greater than 30 nanometers, greater than 50 nanometers, or some other suitable thickness.

The second metal layer 612 is formed on the first metal layer 610 to have a [111] or [110] crystal orientation. In some embodiments, the second metal layer 612 is formed by depositing titanium nitride or some other suitable material over the first metal layer 610 by a PEALD process, a PLD process, or some other suitable process.

In some embodiments, the ferroelectric layer 614 is formed by depositing hafnium-zirconium-oxide (e.g., $Hf_xZr_{1-x}O_y$), scandium doped aluminum nitride, or some other suitable material over the second metal layer 612 by a CVD process, a PVD process, an ALD process, or some other suitable process.

The third metal layer 616 is formed on the ferroelectric layer 614 to have a [111] or [110] crystal orientation. In some embodiments, the third metal layer 616 is formed by depositing titanium nitride or some other suitable material over the ferroelectric layer 614 by a PEALD process, a PLD process, or some other suitable process.

In some embodiments, the fourth metal layer 618 is formed by depositing platinum, titanium, titanium nitride, tantalum, tantalum nitride, tungsten, iron, nickel, beryllium, chromium, cobalt, antimony, iridium, molybdenum, osmium, thorium, vanadium, some combination of the foregoing metals, or some other suitable material over the third metal layer 616 by a CVD process, a PVD process, an ALD process, a PLD process, or some other suitable process. In some embodiments, the first metal layer 610 is formed to have a thickness of greater than 30 nanometers, greater than 50 nanometers, or some other suitable thickness.

Figure 22:
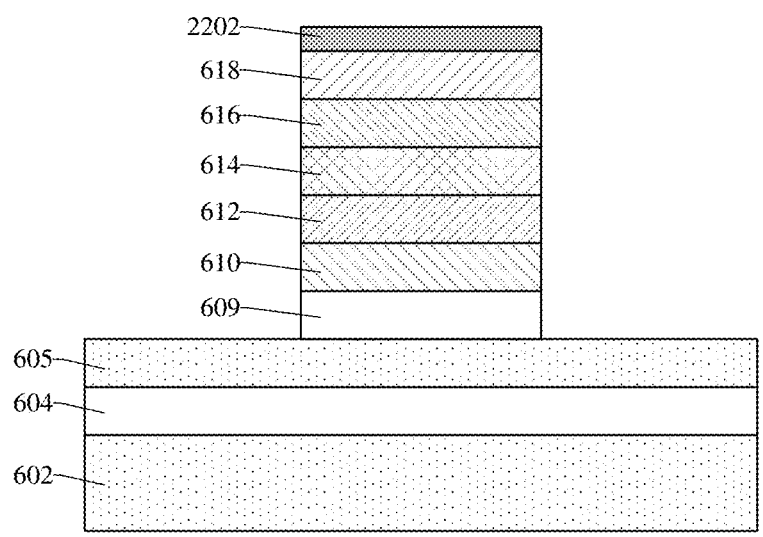

As shown in cross-sectional view 2200 of FIG. 22, a masking layer 2202 is formed over the fourth metal layer 618. The fourth metal layer 618, the third metal layer 616, the ferroelectric layer 614, the second metal layer 612, the first metal layer 610, and the insulator layer 609 are then patterned according to the masking layer 2202 to form a multi-layer stack. In some embodiments, the patterning may comprise a dry etching process or some other suitable etching process. In some embodiments, the masking layer 2202 may comprise a photoresist mask, a hard mask, or some other suitable mask. The masking layer 2202 may be removed after the patterning.

In some embodiments, an anneal is performed after the patterning. For example, the first metal layer 610, the second metal layer 612, the ferroelectric layer 14, the third metal layer 616, and the fourth metal layer 618 are annealed by an RTA process, a furnace anneal process, or some other suitable anneal process. In some instances, the anneal may increase a tensile stress put on the ferroelectric layer 106 and hence may increase a polarization of the ferroelectric layer 106.

Figure 23:
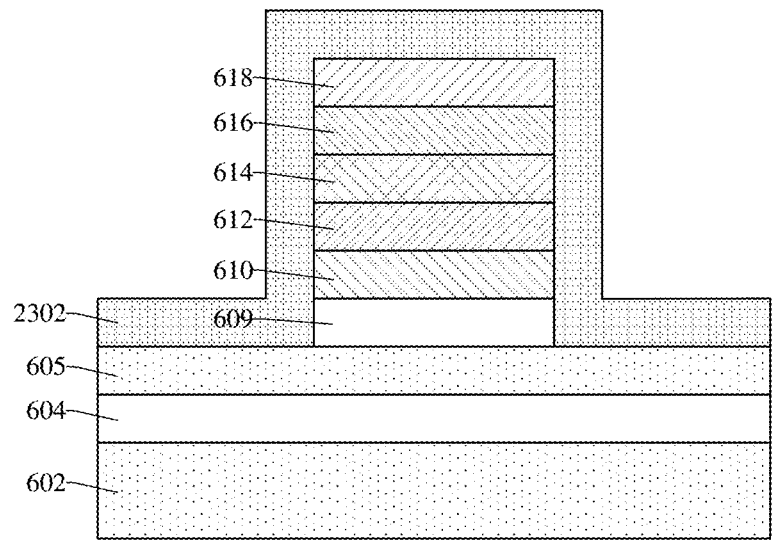

As shown in cross-sectional view 2300 of FIG. 23, a spacer layer 2302 is conformally formed on a top surface of the fourth metal layer 618, sidewalls of the fourth metal layer 618, sidewalls of the third metal layer 616, sidewalls of the ferroelectric layer 614, sidewalls of the second metal layer 612, sidewalls of the first metal layer 610, and on a top surface of the semiconductor layer 605. In some embodiments, the spacer layer 2302 is formed by depositing silicon dioxide, silicon nitride, or some other suitable material over the substrate 602 by a CVD process, a PVD process, an ALD process, or some other suitable process.

Figure 24:
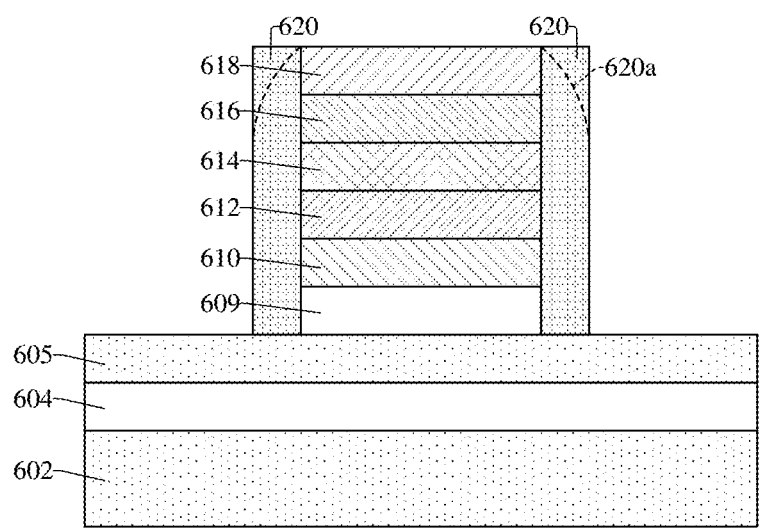

As shown in cross-sectional view 2400 of FIG. 24, the spacer layer (2302 of FIG. 23) is etched to form spacers 620 from the spacer layer. Etching the spacer layer removes the spacer layer from the top surface of the fourth metal layer 618 and from portions of the top surface of the semiconductor layer 605. In some embodiments, the etching comprises a dry etching process or some other suitable process. In some embodiments, the spacers 620 have curved surfaces that extend from sidewalls of the spacers 620 to along the top surface of the fourth metal layer 618 (e.g., as shown by dashed lines 620a) as a result of the etching.

Figure 25:
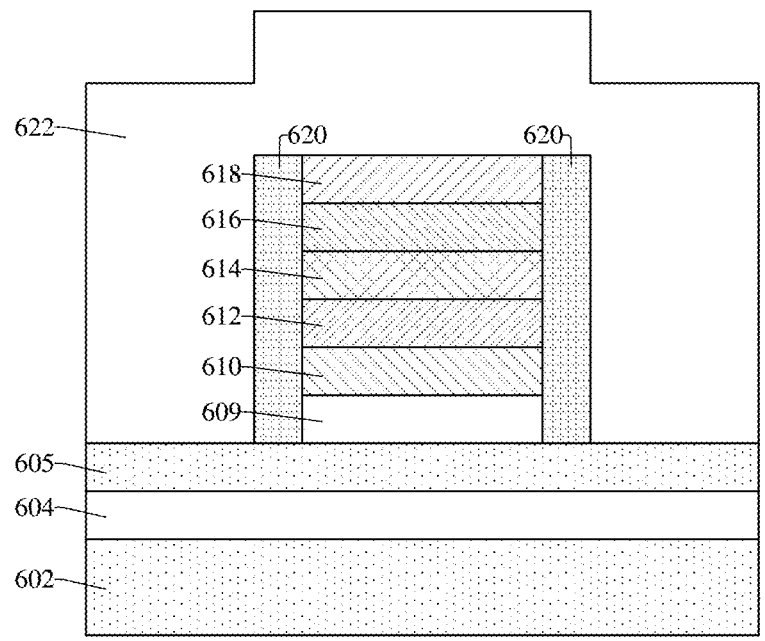

As shown in cross-sectional view 2500 of FIG. 25, a dielectric layer 622 is formed over the substrate 602 on the top surface of the semiconductor layer 605, on sidewalls of the spacers 620, on top surfaces of the spacers 620, and on the top surface of the fourth metal layer 618. In some embodiments, the dielectric layer 622 is formed by depositing silicon dioxide, silicon nitride, or some other suitable material over the substrate 602 by a CVD process, a PVD process, or some other suitable process.

Figure 26:
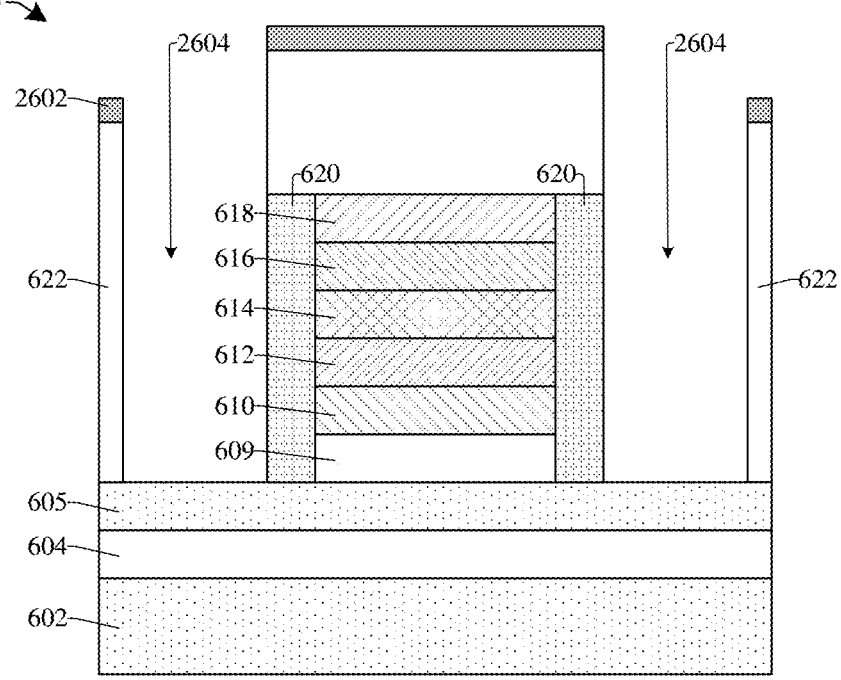

As shown in cross-sectional view 2600 of FIG. 26, a masking layer 2602 is formed over the dielectric layer 622. The dielectric layer 622 is then patterned according to the masking layer 2602 to form openings 2604 in the dielectric layer 622. The openings 2604 uncover portions of the top surface of the semiconductor layer 605. In some embodiments, the patterning may comprise a dry etching process or some other suitable process. In some embodiments, the masking layer 2602 may comprise a photoresist mask, a hard mask, or some other suitable mask. The masking layer 2602 may be removed after the patterning.

Figure 27:
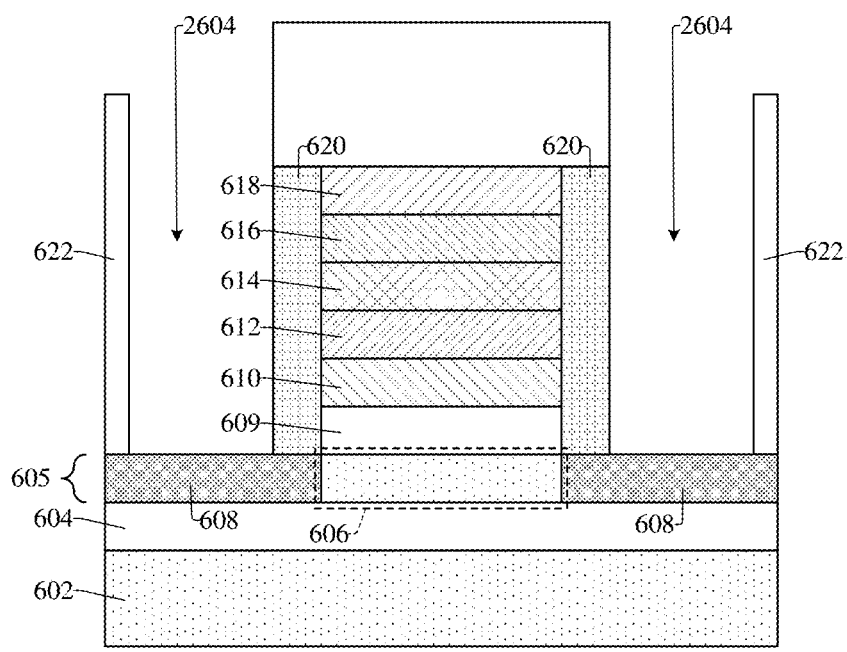

As shown in cross-sectional view 2700 of FIG. 27, a pair of source/drain regions 608 are formed in the semiconductor layer 605 below the openings 2604 by doping portions of the semiconductor layer 605 that are below the openings 2604. In some embodiments, the source/drain regions 608 are doped to have a doping type opposite that of the semiconductor layer 605. In some embodiments, the source/drain regions are formed by an argon, hydrogen, nitrogen, or helium plasma treatment process. In some other embodiments, the source/drain regions 608 are formed by an ion implantation process or some other suitable process.

In addition, a semiconductor channel 606 may extend along the semiconductor layer 605 between the source/drain regions 608. The semiconductor channel 606 extends along a middle portion of the semiconductor layer that extends between the source/drain regions 608 and that is not doped during the formation of the source/drain regions 608.

Figure 28:
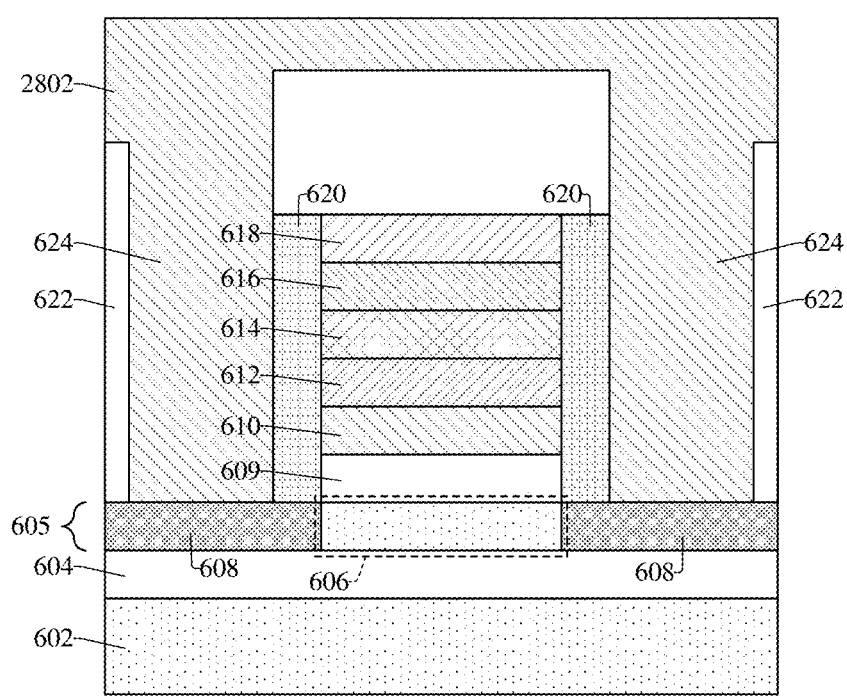

As shown in cross-sectional view 2800 of FIG. 28, a metal 2802 is deposited over the substrate 602 and in the openings (2604 of FIG. 27) to form a pair of source/drain contacts 624 on the source/drain regions 608 in place of the openings. In some embodiments, the metal 2802 comprises aluminum, titanium, tantalum, tungsten, ruthenium, gold, copper, some other suitable metal, or some other suitable material and is deposited by a CVD process, a PVD process, an ALD process, or some other suitable process.

Figure 29:
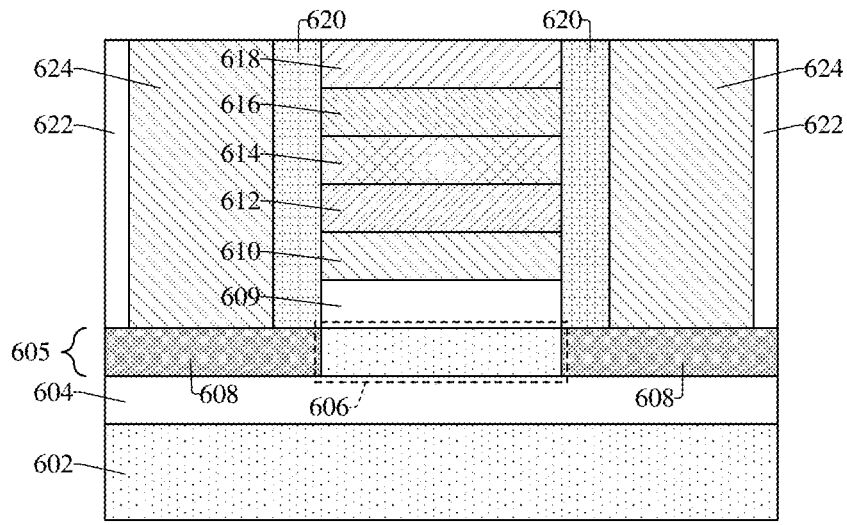

As shown in cross-sectional view 2900 of FIG. 29, a planarization process is performed on the metal (2802 of FIG. 28) and the dielectric layer 622. In some embodiments, the planarization process is also performed on the spacers 620 and the fourth metal layer 618. The planarization process may remove the metal and the dielectric layer 622 from over the fourth metal layer 618. In some embodiments, top surfaces of the source/drain contacts 624, top surfaces of the dielectric layer 622, top surfaces of the spacers 620, and a top surface of the fourth metal layer 618 may be coplanar after the planarization process is performed. In some embodiments, the planarization process may, for example, comprise a CMP or some other suitable planarization process.

Figure 30:
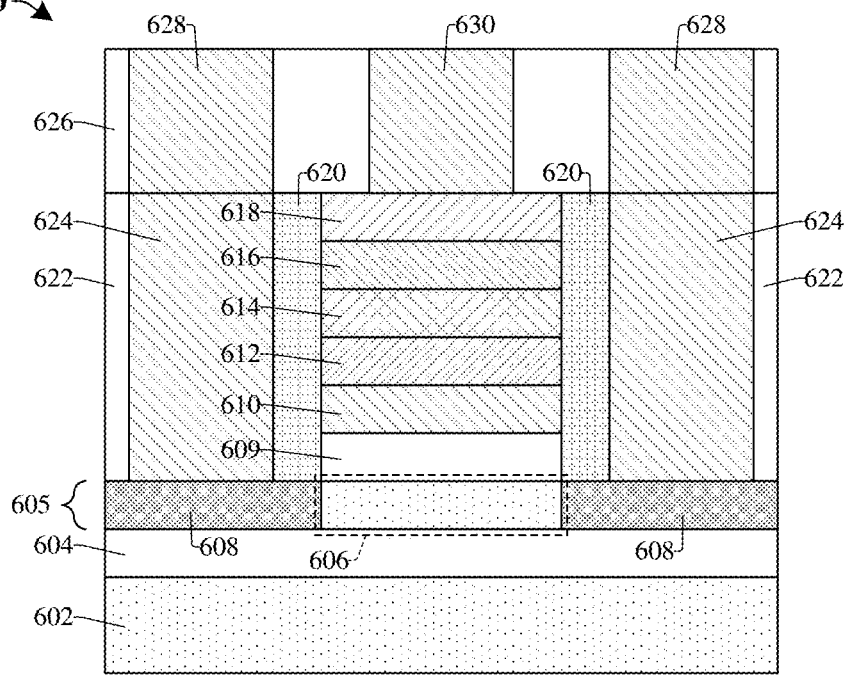

As shown in cross-sectional view 3000 of FIG. 30, first metal wires 628 and a second metal wire 630 are formed within a dielectric layer 626 over the source/drain contacts 624 and the fourth metal layer 618. In some embodiments, forming the first metal wires 628 and the second metal wire 630 within the dielectric layer 626 comprises depositing the dielectric layer 626 (e.g., silicon dioxide, silicon nitride, or some other suitable material) over the substrate 602, patterning the dielectric layer 626, depositing a metal (e.g., aluminum, titanium, tantalum, tungsten, ruthenium, gold, copper, some other suitable metal, or some other suitable material) over the patterned dielectric layer 626 to form the first metal wires 628 and the second metal wire 630, and performing a planarization process (e.g., a CMP or the like) on the metal and the dielectric layer 626.

FIG. 31 illustrates a flow diagram of some alternative embodiments of a method 3100 for forming an integrated chip comprising a first metal layer, a second metal layer on the first metal layer, and a ferroelectric layer on the second metal layer. While method 3100 is illustrated and described below as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

At 3102, deposit a semiconductor layer over a dielectric layer that is over a substrate; deposit an insulator layer over the semiconductor layer, deposit a first metal layer over the insulator layer, deposit a second metal layer over the first metal layer; deposit a ferroelectric layer over the second metal layer; deposit a third metal layer over the ferroelectric layer; and deposit a fourth metal layer over the third metal layer. The second metal layer and the third metal layer are deposited to have [111] or [110] crystal orientations. FIG. 21 illustrates a cross-sectional view 2100 of some embodiments corresponding to act 3102.

At 3104, pattern the fourth metal layer, the third metal layer, the ferroelectric layer, the second metal layer, the first metal layer, and the insulator layer to form a multi-layer stack over the semiconductor layer. FIG. 22 illustrates a cross-sectional view 2200 of some embodiments corresponding to act 3104.

At 3106, perform an anneal (e.g., as described with regard to FIG. 22).

At 3108, deposit a spacer layer over the semiconductor layer, over the fourth metal layer, and along sidewalls of the multi-layer stack. FIG. 23 illustrates a cross-sectional view 2300 of some embodiments corresponding to act 3108.

At 3110, etch the spacer layer to form spacers from the spacer layer. FIG. 24 illustrates a cross-sectional view 2400 of some embodiments corresponding to act 3110.

At 3112, deposit a dielectric over the multi-layer stack and over the semiconductor layer. FIG. 25 illustrates a cross-sectional view 2500 of some embodiments corresponding to act 3112.

At 3114, pattern the dielectric layer on opposite sides of the multi-layer stack. FIG. 26 illustrates a cross-sectional view 2600 of some embodiments corresponding to act 3114.

At 3116, form source/drain regions within the semiconductor layer. In some cases, a semiconductor channel may extend along a portion of the semiconductor layer that extends between the source/drain regions. FIG. 27 illustrates a cross-sectional view 2700 of some embodiments corresponding to act 3116.

At 3118, form source/drain contacts on the source/drain regions within the dielectric layer. FIGS. 28 and 29 illustrate cross-sectional views 2800 and 2900 of some embodiments corresponding to act 3118.

At 3120, form metal wires over the source/drain contacts. FIG. 30 illustrates a cross-sectional view 3000 of some embodiments corresponding to act 3120.

Thus, the present disclosure relates to an integrated chip and a method for forming the integrated chip, the integrated chip comprising a first metal layer and a second metal layer under a ferroelectric layer for improving a performance of the integrated chip.

Accordingly, in some embodiments, the present disclosure relates to an integrated chip. The integrated chip comprises a semiconductor layer over a substrate. A pair of source/drains are arranged along the semiconductor layer. A first metal layer is over the substrate. A second metal layer is over the first metal layer. A ferroelectric layer is over the second metal layer. The first metal layer has a first crystal orientation and the second metal layer has a second crystal orientation different from the first crystal orientation.

In other embodiments, the present disclosure relates to an integrated chip. The integrated chip comprises a semiconductor layer over a substrate. A pair of source/drains are arranged along the semiconductor layer. A first metal layer is over the substrate. A second metal layer is on the first metal layer. A ferroelectric layer is on the second metal layer. The second metal layer has a [110] crystal orientation.

In yet other embodiments, the present disclosure relates to a method for forming an integrated chip. The method comprises depositing a semiconductor layer over a substrate. A pair of source/drains are formed along the semiconductor layer. A first metal layer is deposited over the substrate. A second metal layer is deposited over the first metal layer. A ferroelectric layer is deposited over the second metal layer. The second metal layer is deposited to have a [110] crystal orientation.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An integrated chip comprising:
   a substrate;
   a first metal layer over the substrate;
   a second metal layer over the first metal layer;
   a ferroelectric layer over the second metal layer; and
   a third metal layer over the ferroelectric layer,
   wherein the first metal layer has a first crystal orientation, and wherein the second metal layer and the third metal layer have a second crystal orientation different from the first crystal orientation.

2. The integrated chip of claim 1, further comprising:
   a semiconductor layer over the third metal layer; and
   a pair of source/drain structures laterally spaced over a top surface of the semiconductor layer.

3. The integrated chip of claim 2, further comprising:
   an insulator layer between the third metal layer and the semiconductor layer.

4. The integrated chip of claim 3, further comprising:
   a fourth metal layer over the third metal layer, wherein the insulator layer is over the fourth metal layer, and wherein the semiconductor layer is over the insulator layer.

5. The integrated chip of claim 1, further comprising:
   a semiconductor layer between the substrate and the first metal layer;
   a pair of source/drains along the semiconductor layer;
   a semiconductor channel extending between the pair of source/drains;
   an insulator layer directly over the semiconductor channel, wherein the first metal layer is on the insulator layer; and
   a fourth metal layer on the third metal layer.

6. The integrated chip of claim 5, wherein the first metal layer, the second metal layer, the third metal layer, and the fourth metal layer consist essentially of a first material.

7. The integrated chip of claim 1, wherein the first metal layer, and the second metal layer, and the third metal layer consist essentially of a first material.

8. The integrated chip of claim 7, wherein the first material is titanium nitride.

9. The integrated chip of claim 1, wherein the second metal layer is in contact with a bottom surface of the ferroelectric layer and a top surface of the first metal layer.

10. The integrated chip of claim 1, further comprising:
    a pair of source/drains along the substrate;
    a semiconductor channel extending between the pair of source/drains;
    a gate spaced over the semiconductor channel;
    a first metal interconnect over and coupled to a first source/drain of the pair of source/drains, wherein the first metal layer is over and coupled to the first metal interconnect; and
    a fourth metal layer on the third metal layer.

11. An integrated chip comprising:
    a semiconductor layer over a semiconductor substrate;
    a pair of source/drains arranged along the semiconductor layer;
    a first metal layer comprising a first material over the semiconductor substrate;
    a second metal layer comprising the first material on the first material of the first metal layer; and
    a ferroelectric layer on the first material of the second metal layer; and
    a third metal layer comprising the first material on the ferroelectric layer,
    wherein a crystal orientation of the first metal layer is different than a crystal orientation of the second metal layer, and wherein a crystal orientation of the third metal layer is different than the crystal orientation of the first metal layer and the crystal orientation of the second metal layer.

12. The integrated chip of claim 11, wherein the ferroelectric layer is on a top surface of the second metal layer, and wherein the second metal layer extends continuously from the first metal layer to the ferroelectric layer.

13. The integrated chip of claim 11, wherein the semiconductor layer is over the third metal layer, and wherein the pair of source/drains are on a top surface of the semiconductor layer.

14. The integrated chip of claim 13, further comprising:
    an insulator layer between the third metal layer and the semiconductor layer.

15. The integrated chip of claim 14, further comprising:
    a fourth metal layer between the third metal layer and the insulator layer,
    wherein the first metal layer has a first crystal orientation, the second metal layer has a second crystal orientation, different than the first crystal orientation, and the third metal layer has a third crystal orientation, different than the first crystal orientation and the second crystal orientation.

16. The integrated chip of claim 11, wherein the semiconductor layer is under the ferroelectric layer and under the first metal layer, wherein the pair of source/drains are doped regions of the semiconductor layer, and wherein the integrated chip further comprises:
    an insulator layer directly between the first metal layer and the semiconductor layer; and a fourth metal layer over the third metal layer, wherein the first metal layer has a first crystal orientation, the second metal layer has a second crystal orientation, different than the first crystal orientation, and the third metal layer has a third crystal orientation, different than the first crystal orientation and the second crystal orientation.

17. The integrated chip of claim 11, wherein the pair of source/drains are doped regions of the semiconductor layer, and wherein the integrated chip further comprises:
a gate structure extending over the semiconductor layer between the pair of source/drains; and
a dielectric structure over the semiconductor substrate, wherein the first metal layer, the second metal layer, the ferroelectric layer, and the third metal layer are disposed within the dielectric structure.

18. An integrated chip comprising:
a semiconductor substrate;
a first metal layer over the semiconductor substrate, the first metal layer comprising a first metal material and having a first crystal orientation;
a second metal layer on a top surface of the first metal layer, the second metal layer comprising the first metal material and having a second crystal orientation different than the first crystal orientation;
a ferroelectric layer on a top surface of the second metal layer;
a third metal layer on a top surface of the ferroelectric layer;
a semiconductor layer over a top surface of the third metal-ferroelectric layer; and
a pair of source/drain structures on a top surface of the semiconductor layer.

19. The integrated chip of claim 18, further comprising:
a pair of diffusion regions in the semiconductor layer directly under the pair of source/drain structures, respectively, the pair of diffusion regions comprising metal and semiconductor; and
a pair of metal contacts on and coupled to the pair of source/drain structures, respectively.

20. The integrated chip of claim 18, wherein the pair of source/drain structures comprise metal, are laterally spaced apart over the semiconductor layer, and are directly over the first metal layer, the second metal layer, and the ferroelectric layer, and the third metal layer.

* * * * *